United States Patent
Littrell et al.

(10) Patent No.: US 10,825,982 B1
(45) Date of Patent: Nov. 3, 2020

(54) PIEZOELECTRIC MICRO-ELECTRO-MECHANICAL SYSTEMS (MEMS) DEVICE WITH A BEAM STRENGTHENING PHYSICAL ELEMENT

(71) Applicant: Vesper Technologies Inc., Boston, MA (US)

(72) Inventors: Robert J. Littrell, Boston, MA (US); Karl Grosh, Boston, MA (US); Craig Core, Boston, MA (US); Yu Hui, Boston, MA (US); Wang Kyung Sung, Boston, MA (US)

(73) Assignee: Vesper Technologies Inc., Boston, MA (US)

( * ) Notice: Subject to any disclaimer, the term of this patent is extended or adjusted under 35 U.S.C. 154(b) by 994 days.

(21) Appl. No.: 14/851,432

(22) Filed: Sep. 11, 2015

Related U.S. Application Data

(60) Provisional application No. 62/049,091, filed on Sep. 11, 2014.

(51) Int. Cl.
  *H01L 41/23* (2013.01)
  *H01L 41/113* (2006.01)
(52) U.S. Cl.
  CPC .......... *H01L 41/1132* (2013.01); *H01L 41/23* (2013.01)
(58) Field of Classification Search
  CPC .............................. H01L 41/1132; H01L 41/23
  USPC ....... 310/328, 330–332, 348, 365, 366, 337, 310/336, 367, 344, 311
  See application file for complete search history.

(56) References Cited

U.S. PATENT DOCUMENTS

| | | | |
|---|---|---|---|
| 6,857,501 B1* | 2/2005 | Han | H04R 17/00 181/158 |
| 8,466,606 B2* | 6/2013 | Chen | H03H 3/007 310/344 |
| 8,531,088 B2* | 9/2013 | Grosh | H04R 17/00 310/332 |
| 9,055,372 B2* | 6/2015 | Grosh | H04R 7/06 |
| 9,386,379 B2* | 7/2016 | Sparks | B81C 1/00158 |
| 9,479,875 B2* | 10/2016 | Hall | H04R 23/02 |
| 9,516,421 B1* | 12/2016 | Loeppert | H04R 17/02 |
| 9,853,201 B2* | 12/2017 | Grosh | H04R 17/00 |
| 10,001,391 B1* | 6/2018 | Littrell | G01D 18/00 |
| 2009/0116662 A1* | 5/2009 | Wu | H04R 3/007 381/94.2 |

* cited by examiner

*Primary Examiner* — Thomas M Dougherty
*Assistant Examiner* — Karen B Addison
(74) *Attorney, Agent, or Firm* — Fish & Richardson P.C.

(57) ABSTRACT

A piezoelectric Micro-Electro-Mechanical Systems (MEMS) device comprising: a physical element; and a piezoelectric sensor element, with the physical element positioned in proximity to a moving portion of the piezoelectric sensor element, and with proximity of the physical element to the moving portion reducing a probability of breakage of the piezoelectric sensor element by limiting an excursion of the piezoelectric sensor element, relative to a probability of breakage of the piezoelectric sensor element in another piezoelectric MEMS device without the physical element.

19 Claims, 24 Drawing Sheets

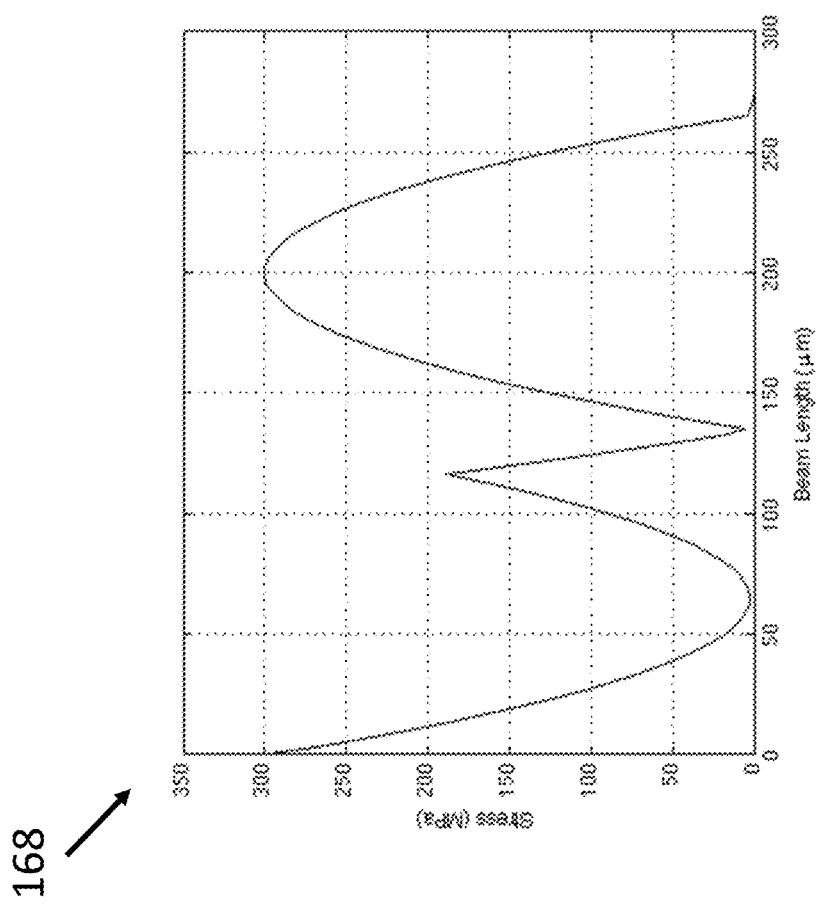

US 10,825,982 B1

PIEZOELECTRIC MICRO-ELECTRO-MECHANICAL SYSTEMS (MEMS) DEVICE WITH A BEAM STRENGTHENING PHYSICAL ELEMENT

CLAIM OF PRIORITY

This application claims the benefit of priority under 35 U.S.C. § 119(e) to provisional U.S. Patent Application No. 62/049,091, filed on Sep. 11, 2014, the entire contents of which are hereby incorporated by reference.

BACKGROUND

Micro-electro-mechanical systems (MEMS) technology has enabled the development of acoustic transducers such as microphones using silicon-wafer deposition techniques. Microphones fabricated this way are commonly referred to as MEMS microphones and can be made in various forms such as capacitive microphones or piezoelectric microphones. MEMS capacitive microphones and electret condenser microphones (ECMs) are used in consumer electronics and have an advantage over typical piezoelectric MEMS microphones in that they have historically had greater sensitivity and lower noise floors. However, each of these more ubiquitous technologies has its own disadvantages. For standard ECMs, they cannot be mounted to a printed circuit board using the typical lead-free solder processing commonly used to attach microchips to the board. MEMS capacitive microphones, which are often used in cell phones, have a backplate that is a source of noise in the microphones. MEMS capacitive microphones also have a smaller dynamic range than typical piezoelectric MEMS microphones.

SUMMARY

In an example, a piezoelectric Micro-Electro-Mechanical Systems (MEMS) device comprises: a physical element; and a piezoelectric sensor element, with the physical element positioned in proximity to a moving portion of the piezoelectric sensor element, and with proximity of the physical element to the moving portion reducing a probability of breakage of the piezoelectric sensor element by limiting an excursion of the piezoelectric sensor element, relative to a probability of breakage of the piezoelectric sensor element in another piezoelectric MEMS device without the physical element.

In this example, a maximum excursion of the piezoelectric sensor element is limited by the physical element. The piezoelectric MEMS device is a MEMS microphone, a transducer, or an acoustic transducer. The physical element is a MEMS layer, a wire bond, a package cap or a microphone package cap. The piezoelectric sensor element comprises a first electrode layer, a second electrode layer and a piezoelectric layer sandwiched between the first and second electrode layers. The physical element is located at a vertical distance above the moving portion of the piezoelectric sensor element that allows for a particular operating range of the moving portion. The physical element causes a redistribution of stress from a base of the moving portion throughout a body of the moving portion. The redistribution causes a maximum stress to occur at the physical element. The maximum stress is less than or equal to a fracture stress at which the moving portion fractures. A base of the moving portion is a point at which a variable x denoting a point on an axis equals 0 (x=0), wherein the axis extends from a beginning point at x=0 to a point at the end of the moving portion at which x=L, the length of the moving portion; wherein a portion of the moving portion extending from x=0 to a location of the physical element (x=x0) is a first region; wherein a portion of the moving portion extending from x=x0 to x=L is a second region; wherein the location of the physical element (x=x0) along the axis extending from x=0 to x=L is a point at which stress from the first region on the moving portion equals stress from the second region on the moving portion. The physical element is a first physical element and wherein the piezoelectric MEMS device further comprises: a second physical element positioned in proximity to the moving portion of the piezoelectric sensor element. The first and second physical elements are each a same vertical distance above the moving portion. The second physical element is a wire bond, a package cap or a microphone package cap. The first and second physical elements causes a redistribution of stress from a base of the moving portion throughout a body of the moving portion. The redistribution causes a maximum stress to occur at each of the first and second physical elements. The maximum stress is less than or equal to a fracture stress at which the moving portion fractures.

In this example, the MEMS device further includes a substrate, and wherein the piezoelectric sensor element comprises a plurality of tapered, transducer beams, with a tapered, transducer beam comprising a piezoelectric layer and a pair of electrode layers sandwiching the piezoelectric layer, the tapered, transducer beams each having a beam base, a beam end, and a beam body, the tapered, transducer beams connected in a cantilever arrangement over the substrate by having the beam bases attached to the substrate, the beam ends converging towards a single point, and with each beam body free from the substrate and with each beam end free and unattached. The MEMS device further includes a substrate and wherein the piezoelectric sensor element comprises a plurality of beams each supported at one end by the substrate such that each beam is cantilevered and extends between a fixed end and a free end, wherein at least two of the beams are positioned such that free ends of each beam face one another and are separated by a gap.

In another example, a method includes fabricating a piezoelectric sensor element with a moving portion that is configured to move in response to input pressure; and positioning a physical element over at least part of the moving portion of the piezoelectric sensor element, with the physical element positioned in proximity to the moving portion of the piezoelectric sensor element, and with proximity of the physical element to the moving portion reducing a probability of breakage of the piezoelectric sensor element by limiting an excursion of the piezoelectric sensor element, relative to a probability of breakage of the piezoelectric sensor element in a piezoelectric MEMS device without the physical element. Other embodiments of this aspect include corresponding computer systems, apparatus, and computer programs recorded on one or more computer storage devices, each configured to perform the actions of the methods.

In this example, the piezoelectric sensor element is a non-capacitive sensor element. The actions include determining a height at which to position the physical element over the moving portion by determining a height that enables the moving portion to operation within a particular operating range and that increases the amount of pressure that is sustainable by the moving portion, relative to the amount of pressure that is sustainable by the moving portion independent of the physical element; and determining an amount of horizontal displacement of the physical element away from a base of the moving portion by determining a location on the moving portion at which a stress of the base corresponds to a stress of the moving portion.

The details of one or more implementations are set forth in the accompanying drawings and the description below. Other features, objects, and advantages will be apparent from the description, the drawings, and the claims.

BRIEF DESCRIPTION OF THE FIGURES

FIGS. 13, 14, 17 and 18A, 18B are each diagrams of deformation and stress profiles.

DETAILED DESCRIPTION

Figure 1:
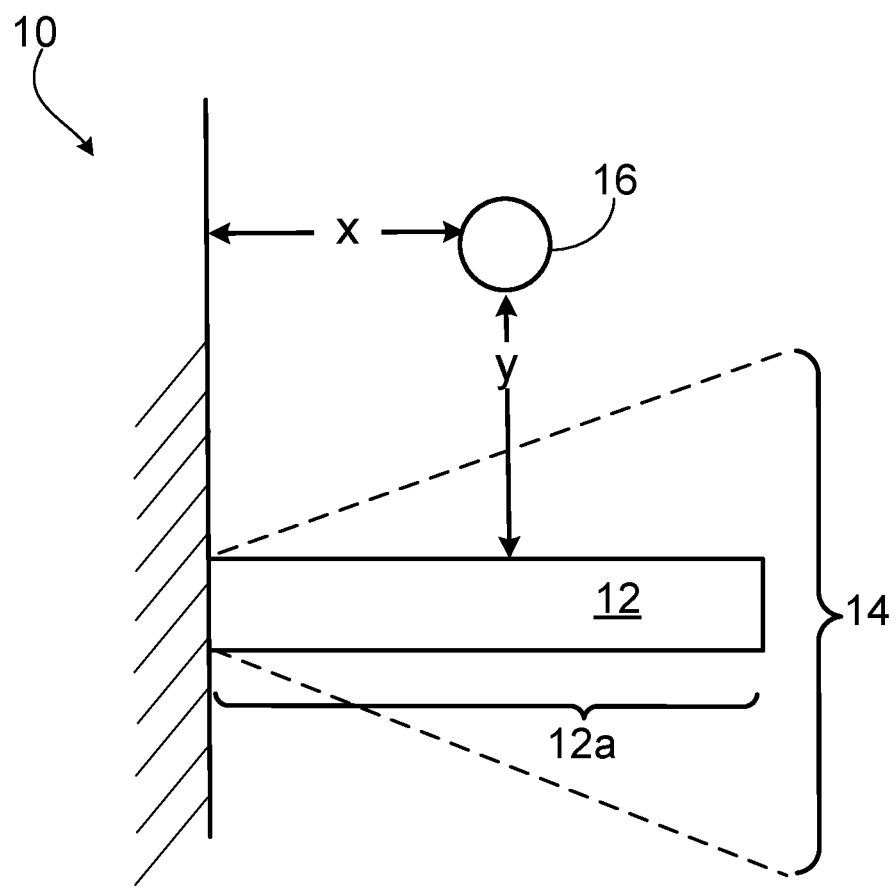
FIGS. 1, 4-6 are diagrams of a plate.

Referring to FIG. 1, diagram 10 is a cross-sectional view of plate 12 and physical stop 16, such as wire. In this example, physical stop 16 (i.e., physical element) is a (relatively) stationary element, e.g., a relatively non-moving object, or a bending stop (e.g., a stop or physical element that is flexible or at least partially flexible). There are various types of physical elements, including, e.g., a MEMS layer, an object (such as a cap protrusion), and so forth. In the example of a stationary element, the element would be more rigid than the beam, but if the beam pushes on the element, the element will still move a little. There are various other kinds of stationary elements, including, e.g., a bending stop. Diagram 10 illustrates an operating range 14 of deflection of plate 12, e.g., a plate in a microphone or transducer, such as those described in U.S. Pat. Nos. 8,531,088 and 9,055,372, the entire contents of each of which are incorporated herein by reference. In this example, length 12a of plate 12 is shown. In this example, as acoustic pressure is applied to plate 12, plate 12 deflects upwards or downwards (or some combination thereof) in range 14, e.g., ten microns. In this example, plate 12 may deflect upwards 5 microns or downwards 5 microns, which is a normal operating range. In another example, the plate is included in a microphone of a mobile device. In this example, a user of the mobile device drops the device, causing an increase in an amount of acoustic pressure applied to the beam. This increased acoustic pressure causes plate 12 to deflect a large amount that is outside normal operating range 14 of plate 12. This increased deflection beyond the normal operating range increases an amount of stress on plate 12, which may cause plate 12 to break. Physical stop 16, such as wire, may be used to redistribute the stress among multiple points of plate 12, thereby reducing a probability of breakage. In this example, physical stop 16 limits an excursion (e.g., a maximum excursion) of plate 12, by preventing plate 12 from displacement in the y-direction above physical stop 16. In an example, physical stop 16 is placed above operating range 14, e.g., to not interfere with normal operation of plate 12. Using the techniques described herein, an optimal location of physical stop 16 in the x-direction (e.g., a location across a width of beam 12) and the y-direction above beam 12 is determined, e.g., to preserve the operating range and provide for stress redistribution.

Figure 2:
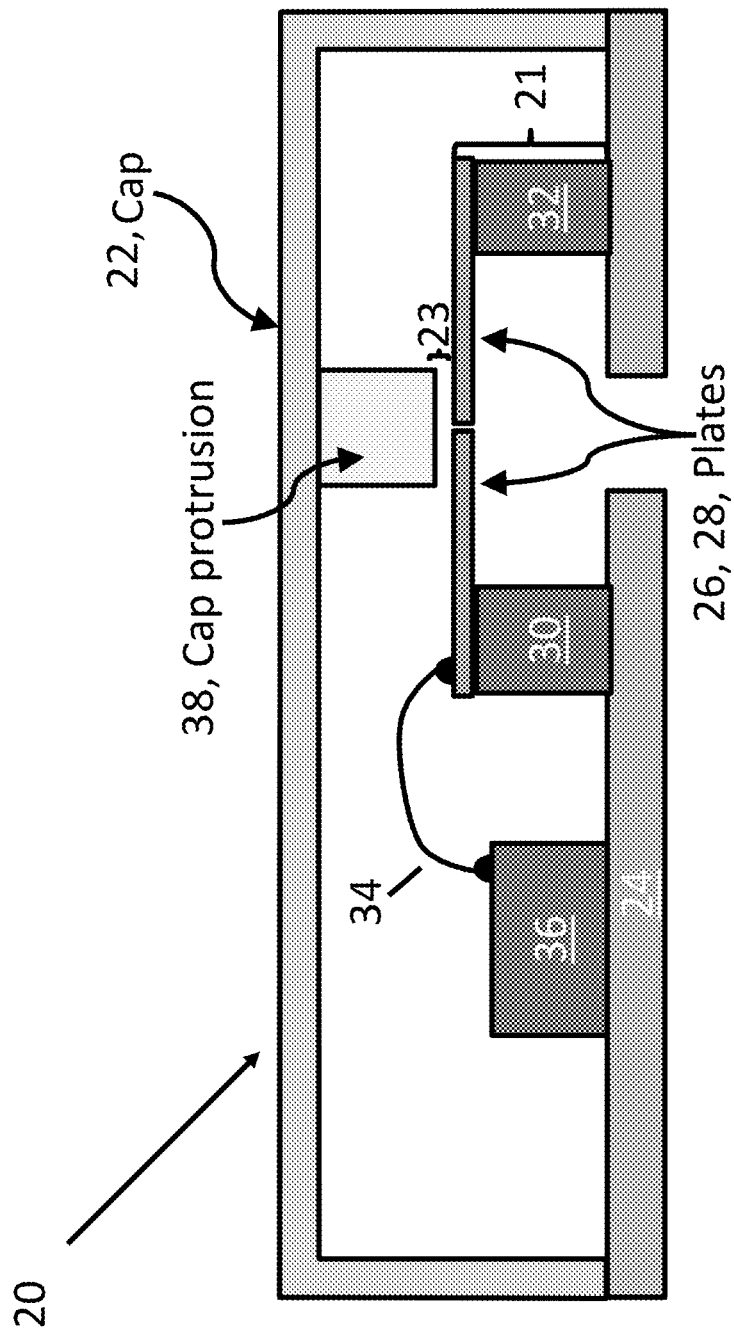
FIGS. 2-3 are each diagrams of a piezoelectric MEMS device.

Referring to FIG. 2, package 20 includes MEMS microphone 21, which includes plates 26, 28 and plate bases 30, 32, respectively. Package 20 includes cap 22 to encapsulate MEMS microphone 21 and substrate 24, e.g., a microphone package substrate. In an example, microphone 21 is fabricated on a silicon wafer substrate (not shown). In this example, the MEMS die is placed on substrate 24 after fabrication. Package 20 also includes circuitry 36 (e.g., an integrated circuit) that is electrically connected via wire bond 34 to microphone 21. In this example, MEMS microphone 21 has a relatively highly compliant diaphragm (i.e., plates 26, 28) that provides high sensitivity and signal-to-noise ratio (SNR). However, this highly compliant diaphragm makes MEMS microphone 21 more susceptible to breaking as a result of a large puff of air impinging on the microphone.

A capacitive MEMS microphone prevents plates from breaking off the microphone by using a very stiff backplate, which prevents the microphone diaphragm from deflecting too far, thereby limiting the maximum stress in the diaphragm. A capacitive MEMS microphone necessarily includes a backplate to form the capacitor with a diaphragm (e.g., the front plate). A piezoelectric MEMS microphone typically does not have a backplate, which would generate noise in the microphone. To prevent breaking of plates due to stress, a backplate or wire bond is inserted above the diaphragm to redistribute stress. The backplate or wire bond is sized and positioned above the microphone to produce a minimal amount of noise while substantially redistributing stress, e.g., using the techniques described herein.

In the example of FIG. 2, to prevent a piezoelectric MEMS microphone from breaking, package 20 includes physical stop 38 (e.g., a stationary body) that is placed in close proximity to the diaphragm (e.g., plates 26, 28—the moving portion of the microphone or sensor). Generally, beams or plates include the moving portion of an acoustic sensor (e.g., a piezoelectric sensor element), because they move in response to input pressure. In this example, the microphone package cap (or a package cap) is modified to include a small, interior protrusion (i.e., physical stop 38) that forms small gap 23 between protrusion 38 on package cap 22 and MEMS device 21. When modifying the microphone package cap 22, protrusion 38 is configured to extend down to plates 26, 28 (e.g., which are fabricated on a MEMS die) to create a small (~50 um) gap between protrusion 38 and plates 26, 28. Alternatively, the physical stop is provided by one or more wire-bonds that are disposed over a MEMS die, above the diaphragm. In this example, the ends of the wire-bonds are bonded to a non-sensing part of the die, as show with regard to FIG. 3. In this example, the proximity of the stationary element (e.g., protrusion 38) to the moving portion (e.g., plates 26, 28) reduces a probability of breakage of the piezoelectric sensor element (e.g., microphone 21) by limiting an excursion of the piezoelectric sensor element, relative to a probability of breakage of the piezoelectric sensor element in another piezoelectric MEMS device without the stationary element.

Figure 3:
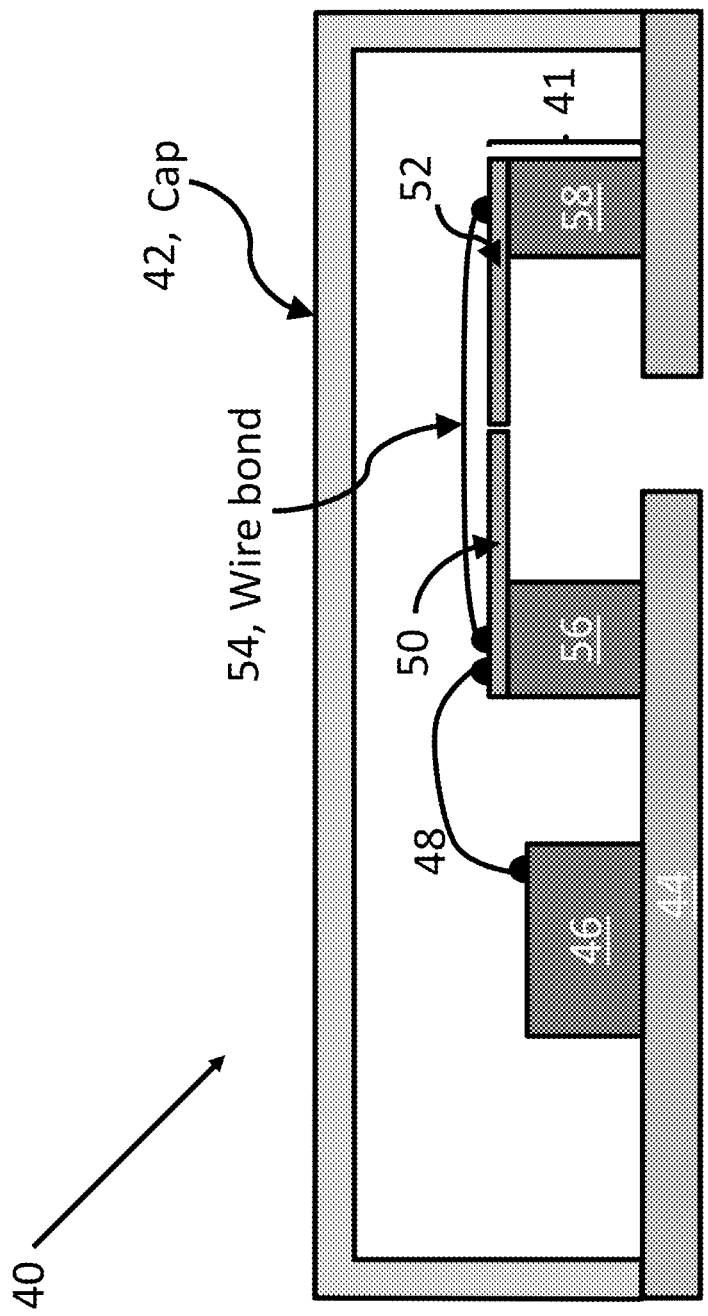

Referring to FIG. 3, package 40 includes MEMS microphone 41, which includes plates 50, 52 and plate bases 56, 58, respectively. Package 40 includes cap 42 to encapsulate MEMS microphone 41 and substrate 44 on which MEMS microphone 41 is fabricated. Package 40 also includes circuitry 46 (e.g., a circuit board) that is electrically connected via wire bond 48 to microphone 41. To reduce or redistribute an amount of stress on plates 50, 52, one or more wire-bonds are above plates 50, 52 (i.e., the diaphragm) on the MEMS die of microphone 41.

There are various other ways of adding a stationary stop above the diaphragm, including, e.g., by adding a step to the package substrate (e.g., substrate 44) which reduces the gap between the MEMS die and the package cap (e.g., a layer is built on the substrate to effectively move the diaphragm closer to the cap), by adding an additional layer to the MEMS structure which limits the displacement, and so forth. Alternatively, the physical stop is provided by one or more wire-bonds 54 that are disposed over the MEMS die, above the diaphragm. In this example, the ends of the wire-bonds are bonded to a non-sensing part of the die.

Figure 4:
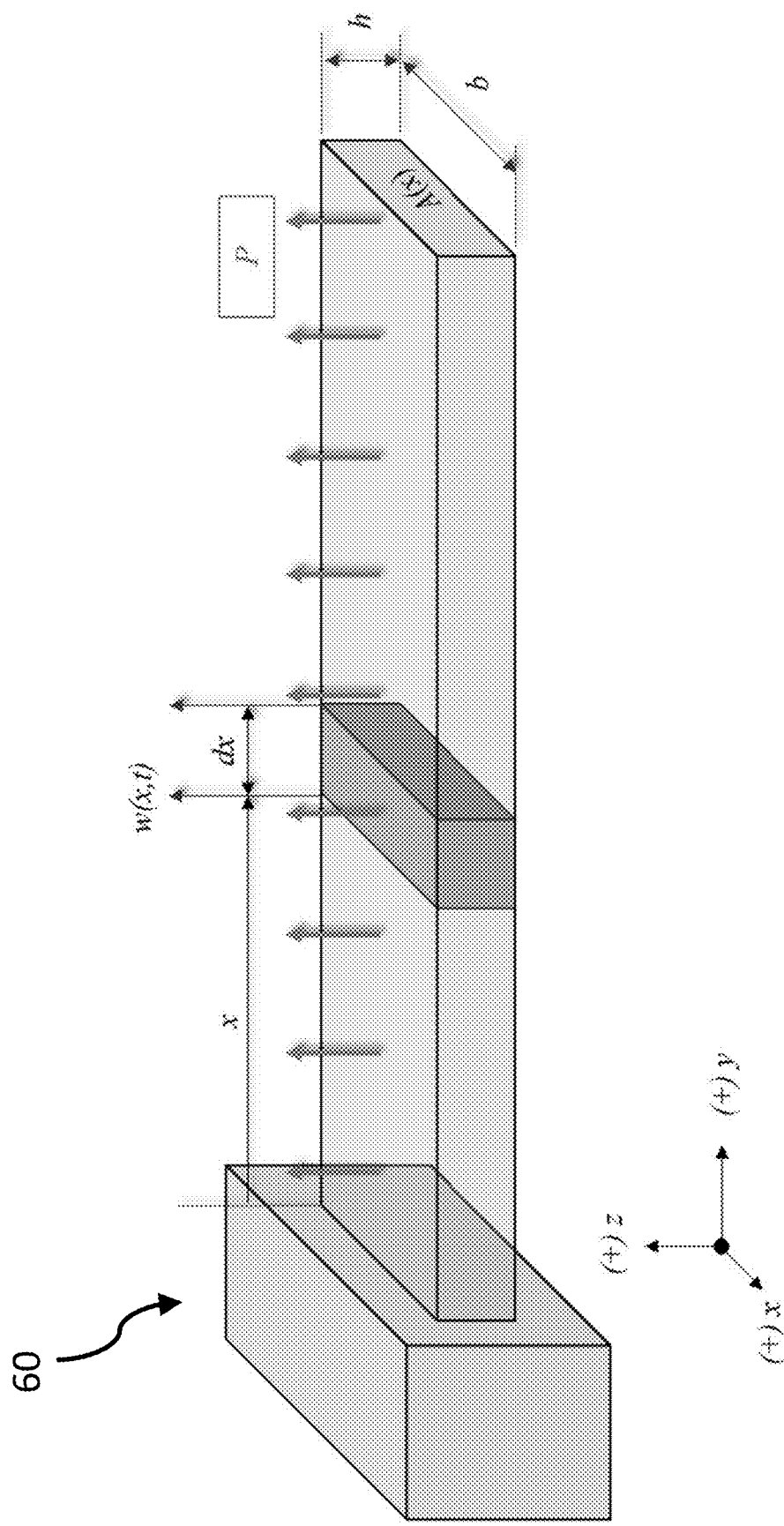
Figure 5:
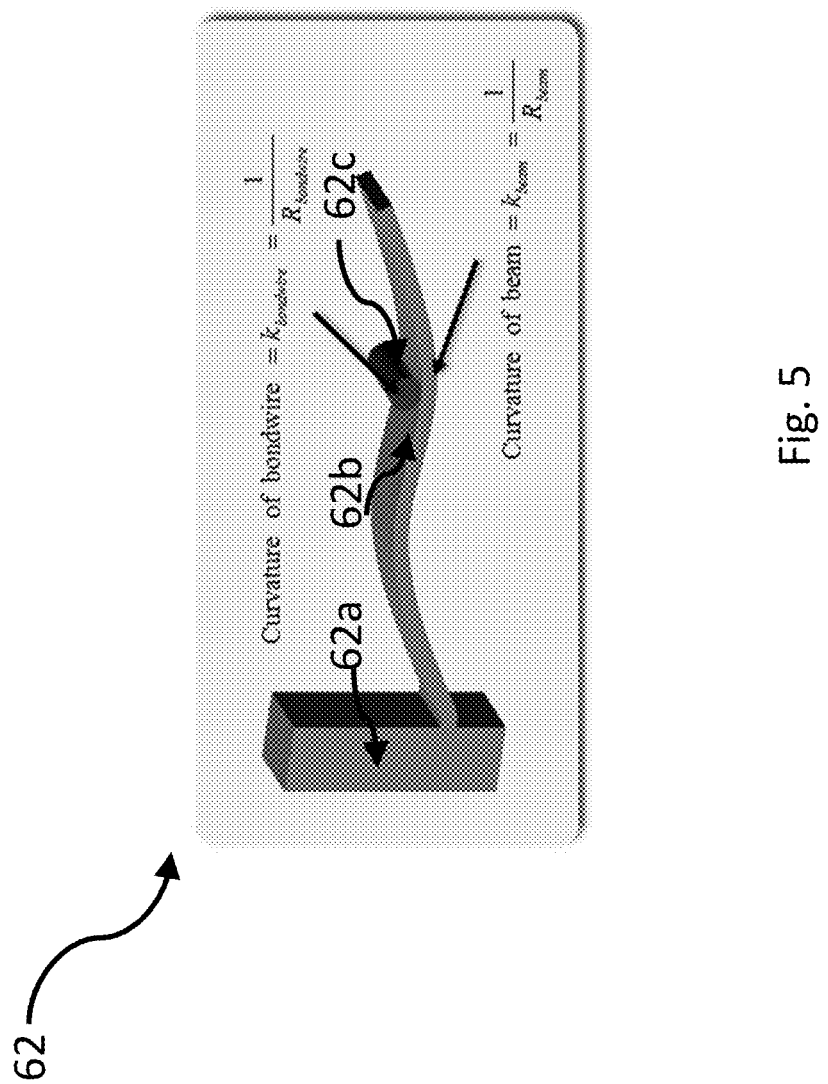

The foregoing description and figures describe how to identify the optimal position of bending stop(s) (i.e., a physical stop—such as a wire). Referring to FIG. 4, beam 60 is a straight beam made from a single material with uniform thickness. The properties of beam 60 are shown in the below Table 1:

TABLE 1 f(x,t) = uniform pressure across beam = P
Width of beam = b
Thickness across the beam = h
Effective Young's modulus = E
Tensile fracture stress = 300 MPa For the beam 60 with the properties described in Table 1, a wire (e.g., a physical stop) and a beam create a point of contact. Referring to FIG. 5, diagram 62 illustrates beam 62b connected to beam base 62a. In an example, beam 62b is beam 60 in FIG. 4. In this example, bondwire 62c creates a point contact with beam 62b. In this example, the radius of the bondwire is $R_{bondwire}$.

The curvature of beam 62b is shown in Table 1A:

TABLE 1A

Curvature of beam = $k_{beam} = \frac{1}{R_{beam}}$

Figure 6:
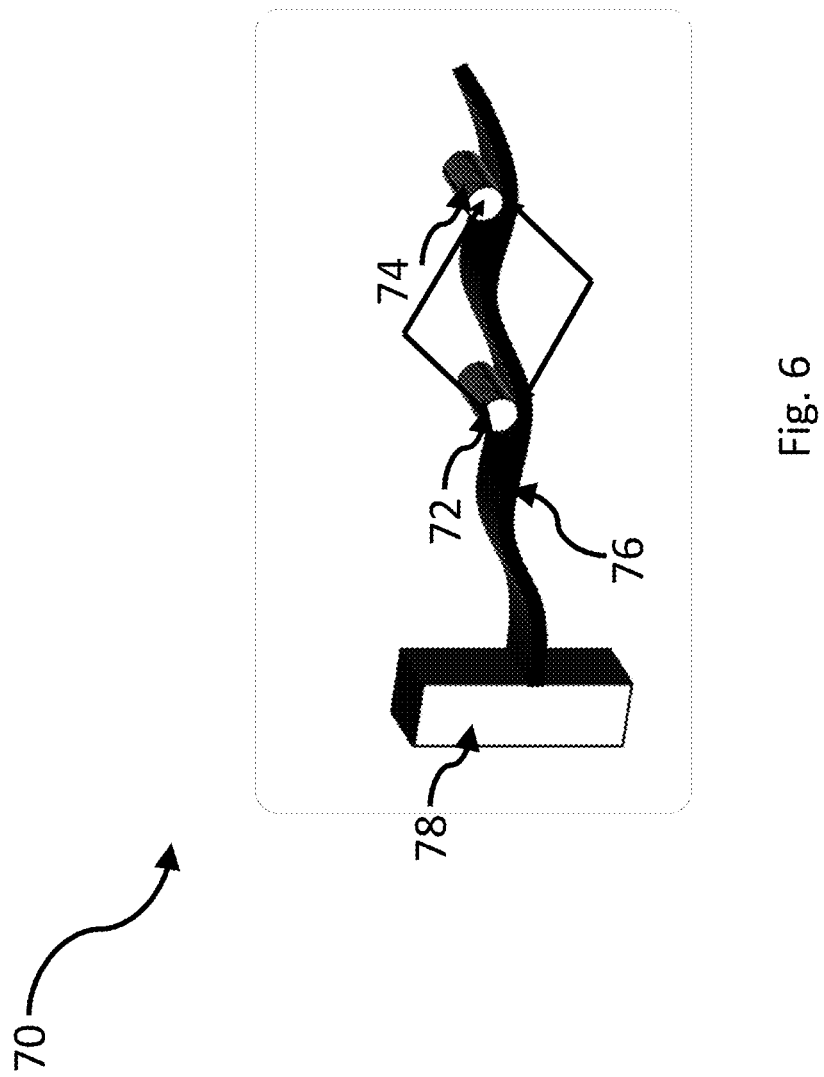

In this example, $R_{beam}$ is the radius of curvature of beam 62b. The curvature of beam 62b is an example bending profile with one bending stop, e.g., for an example bondwire diameter of twenty-five microns. In this example, the radius of curvature of the beam is larger than the radius of the bondwire. Therefore, the beam is making point contact (e.g., in a 2D analysis) with the bondwire and is not curling around the bondwire. Referring to FIG. 6, diagram 70 shows two bending stops, i.e., stops 72, 74, that create point contacts with beam 76 (that is attached to beam base 78). In this example, $R_{beam} \gg R_{bondwire}$ and the contact between beam 76 and bending stops 72, 74 are a line contact in three dimensions or a point contact in a two dimensional analysis. In this example, $R_{beam}$ and $R_{bondwire}$ are determined using the foregoing equations.

Figure 7:
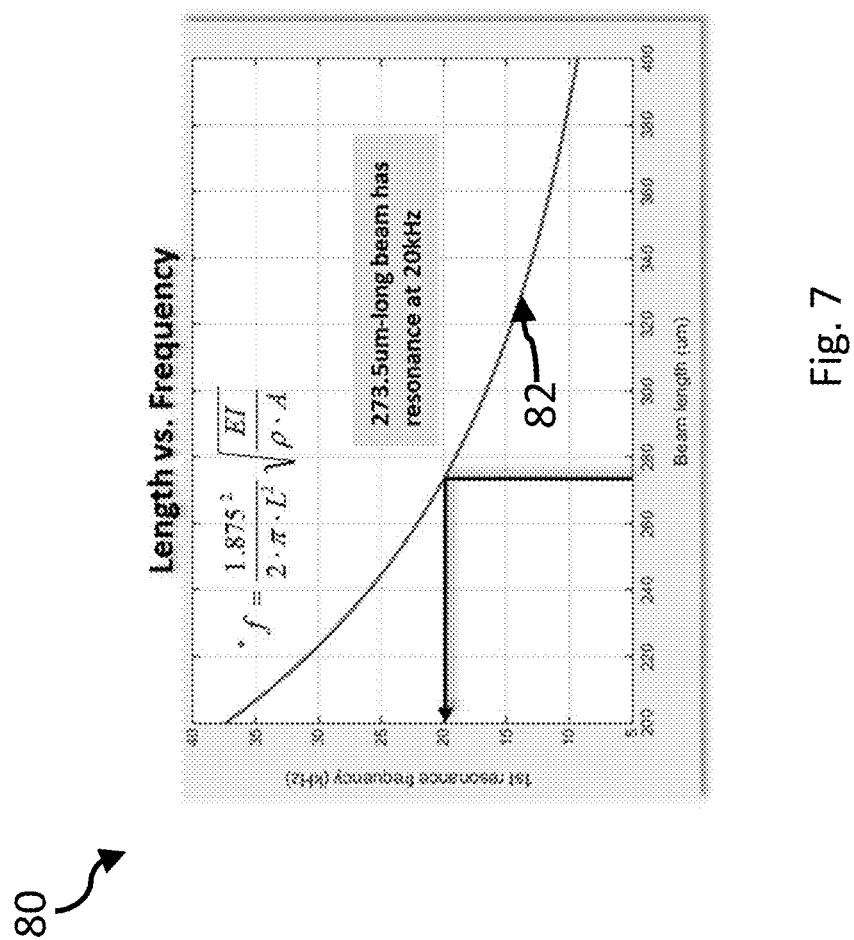
FIG. 7 is a diagram of a relationship between length and frequency.

Referring to FIG. 7, graph 80 illustrates the relationship between length and frequency. In this example, beams can be of varying lengths in accordance with line 82. In this example, line 82 depicts the relationship between beam length and resonance frequency, which is also represented by the below equation in Table 1B:

TABLE 1B $$*f = \frac{1.875^2}{2 \cdot \pi \cdot L^2} \sqrt{\frac{EI}{\rho \cdot A}}$$

In this example, *f is the resonance frequency. E is the effective Young's modulus. L is the beam length. I is the area moment of inertia. A is the area of the beam. ρ is the density of the beam. In this example, a 237.5 micron (um) long beam with a width of 20 um has a resonance at 20 kHz and a fracture pressure ($P_{fracture}$) of 1337 Pa, with a 40 um deflection at the tip. In this example, the fracture pressure is the pressure at which the beam fractures.

Figure 8:
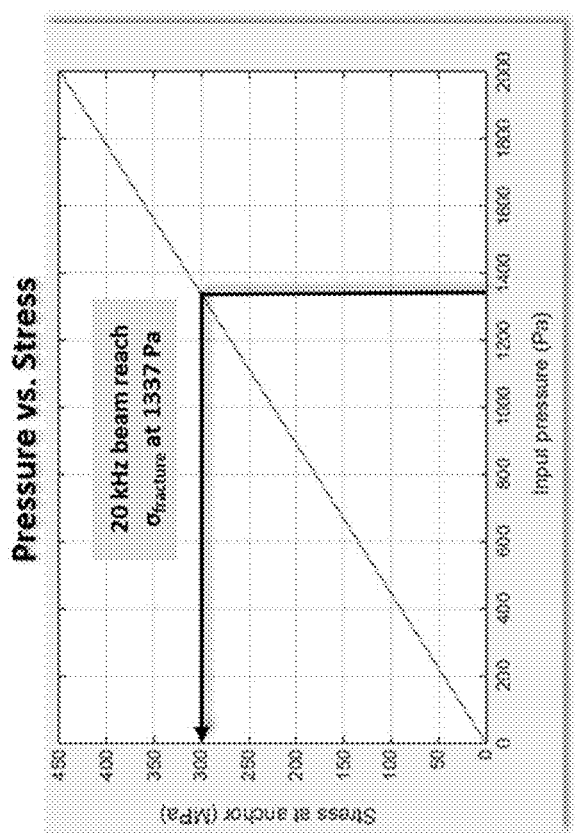
FIG. 8 is a diagram of a relationship between pressure and stress.
Figure 9:
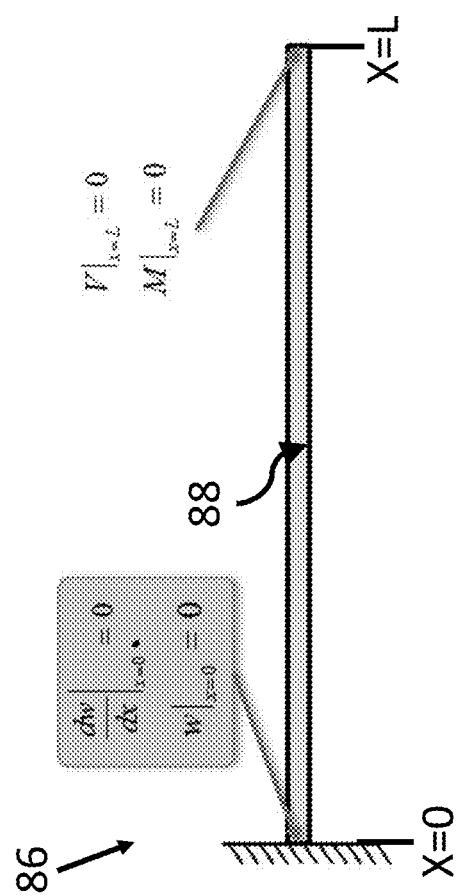
FIGS. 9 and 15 are each diagrams of a beam and associated conditions without a bending stop.

Referring to FIG. 8, diagram 84 illustrates the relationship between pressure and stress, without physical stops, of a beam. In this example, a 20 kHz beam reaches its fracture stress ($\sigma_{fracture}$) at 1337 Pa. Referring to FIG. 9, diagram 86 illustrates fixed boundary conditions for beam 88 (e.g., which is a same beam as beams 60, 62b and/or 76), in an example with no physical stops. Generally, a boundary condition is a condition that is required to be satisfied at all or part of the boundary of a region in which a set of differential equations is to be solved. In this example, beam 88 has a length of L. The length of beam 88 along an x-axis is represented as the length from x=0 (i.e., a point at which beam 88 is adjacent to a beam base or affixed to another structure) to x=L, which is a point at the end or tip of beam 88. In this example, the boundary conditions at x=00 are shown in the below Table 1C:

TABLE 1C $\left.\frac{dw}{dx}\right|_{x=0} = 0$ $\left.w\right|_{x=0} = 0$

In this example, the slope of beam 88 is represented as dw/dx. In this example, "w" is the displacement in the y-direction at a particular x-point. Accordingly, $$\left.\frac{dw}{dx}\right|_{x=0} = 0$$

represents that the slope of beam 88 is zero when x=0. The displacement in the y-direction is also zero, when x=0, as represented by $w|_{x=0}=0$. In this example, the boundary conditions at x=L are shown in the below Table 1D:

TABLE 1D $V|_{x=L} = 0$
$M|_{x=L} = 0$

In this example, V is sheer force in the vertical direction and M is a moment on the beam 88 (i.e., Moment=Force*Perpendicular Distance). In this example, w (without a physical stop) is determined in accordance with the equation shown in the below Table 1E:

TABLE 1E $$w = \frac{P \cdot b}{EI} \cdot \left( \frac{1}{24} \cdot x^4 - \frac{L}{6} \cdot x^3 + \frac{L^2}{4} \cdot x^2 \right)$$

In this example, P is the uniform pressure across the beam. b is the width of the beam. E is the effective Young's modulus. I is the area moment of inertia. L is the length of the beam. x is variable and represents a location on the axis from x=0 to x=L.

In this example, maximum stress ($\sigma$) in beam 88 (without physical stops) is determined in accordance with the equation shown in the below Table 1F:

TABLE 1F $$\sigma = \frac{h \cdot P \cdot b}{4 \cdot I} \cdot (x - L)^2$$

In this example, the variables shown in Table 1F are as described above.

Figure 10:
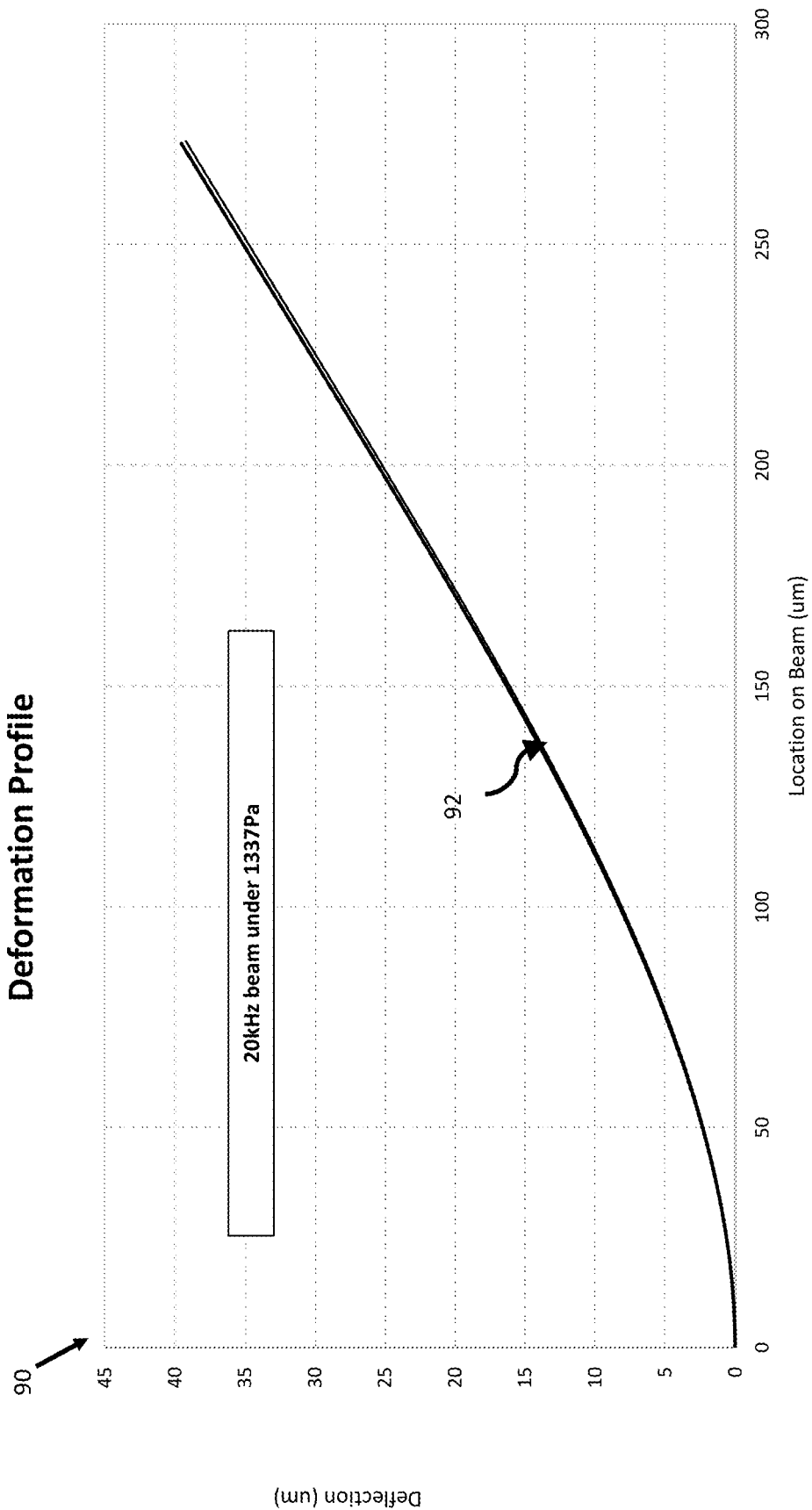
FIG. 10 is a diagram of a deformation profile.

Referring to FIG. 10, deformation profile 90 of a beam (without physical stops) is shown in a 20 kHz straight beam with a single layer. In this example, line 92 illustrates that as the location on the beam (e.g., along the axis from x=0 to x=L) increases, the amount of deflection also increases. Deformation profile 90 predicts the maximal allowance for the deflection.

Figure 11:
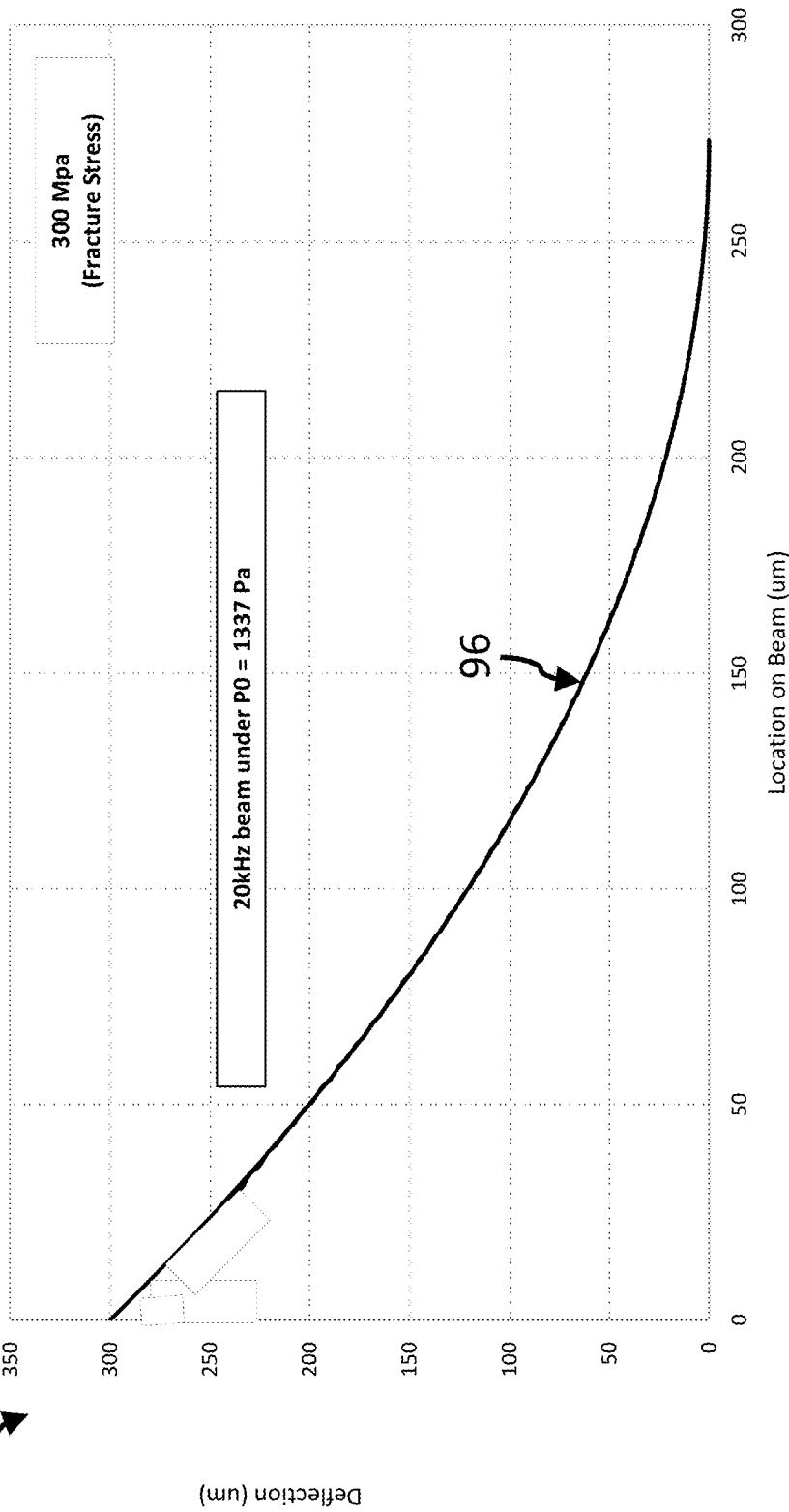
FIG. 11 is a diagram of a stress profile.

Referring to FIG. 11, stress profile 94 of the beam is shown. Line 96 illustrates the relationship between the location on the beam (e.g., from x=0 to x=L) to stress. As shown, stress increases as the location on the beam approaches the beam base or x=0. In this example, the fracture stress is 300 MPa, which is associated with the base of the beam. Additionally, the beam will sense pressure until it freely deflects.

Figure 12:
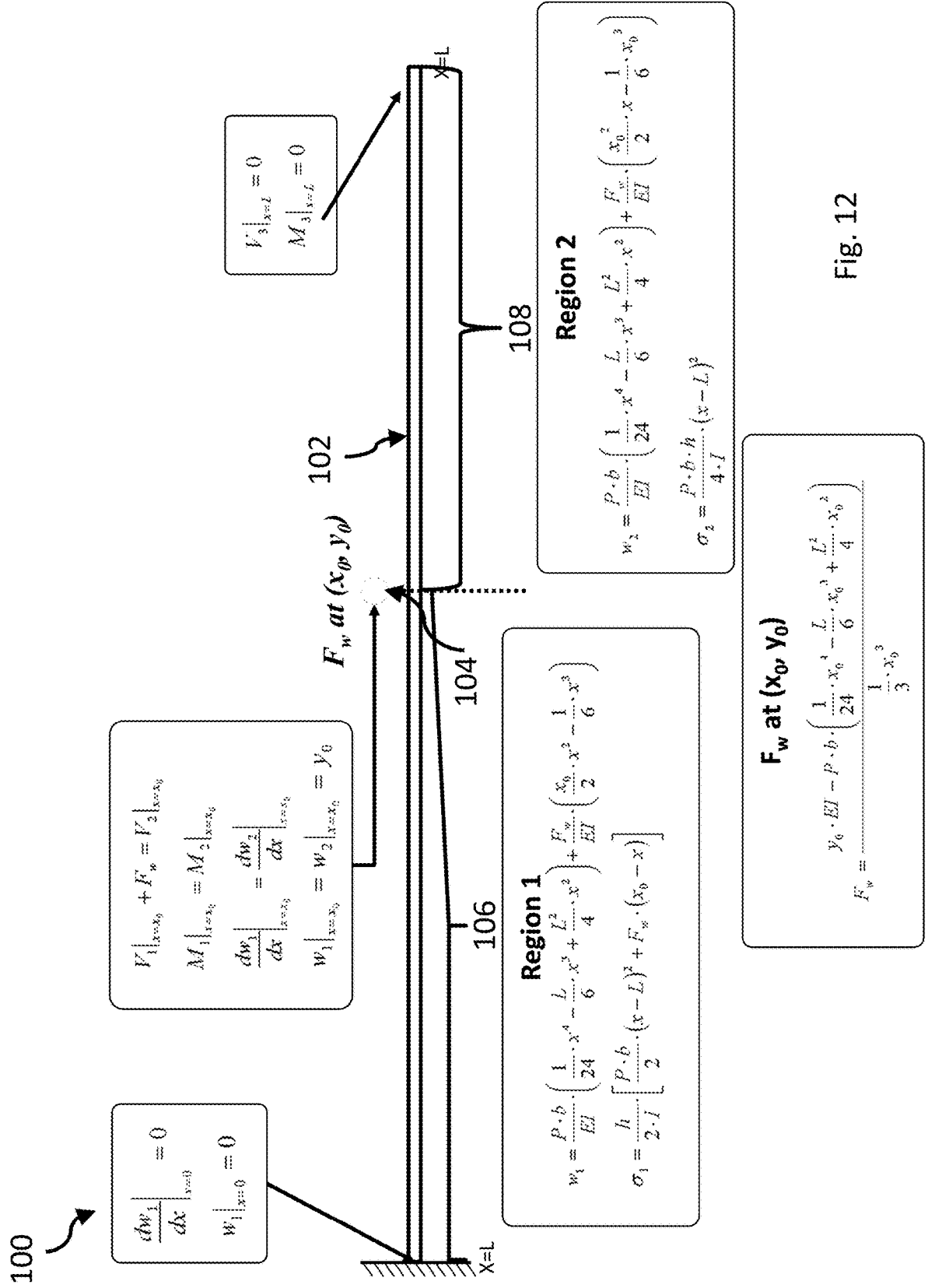
FIGS. 12 and 16 are each diagrams of a beam and associated conditions with bending stops.

Referring to FIG. 12, diagram 100 illustrates boundary conditions, beam stress and displacement in the y-direction (at various x locations) for a single bending-stop (e.g., a single physical stop). In this example, physical stop 104 is located at a distance $y_0$ above beam 102. Physical stop 104 exerts a force $F_w$ on beam 102 to maintain the displacement $y_0$. In this example, $x_0$ represents the location of physical stop 104 on the beam. That is, $x_0$ represents a point on the axis ranging from x=0 to x=L at which stop 104 is located. $y_0$ represents the location of physical stop 104 above the beam.

In this example, $F_w$ at ($x_0$, $y_0$) is represented as shown in the below Table 2:

TABLE 2

$$F_w = \frac{y_0 \cdot EI - P \cdot b \cdot \left( \frac{1}{24} \cdot x_0^4 - \frac{L}{6} \cdot x_0^3 + \frac{L^2}{4} \cdot x_0^2 \right)}{\frac{1}{3} \cdot x_0^3}$$

In this example, the boundary conditions at x=0 are shown below in Table 3:

TABLE 3

$$\left. \frac{dw_1}{dx} \right|_{x=0} = 0$$

TABLE 3-continued $$\left. w_1 \right|_{x=0} = 0$$

In this example, $w_1$ represents the displacement in the y-direction at the particular point x=0. In this example, the slope of beam 102 at x=0 is zero and the vertical displacement in the y-direction at x=0 is also zero.

In this example, physical stop 104 breaks beam 102 in region 106 (i.e., region 1) and region 108 (i.e., region 2).

In the example, the boundary conditions at $x_0$, $y_0$ are represented as shown in the below Table 4:

TABLE 4

$$\left. V_1 \right|_{x=x_0} + F_w = \left. V_2 \right|_{x=x_0}$$

$$\left. M_1 \right|_{x=x_0} = \left. M_2 \right|_{x=x_0}$$

$$\left. \frac{dw_1}{dx} \right|_{x=x_0} = \left. \frac{dw_2}{dx} \right|_{x=x_0}$$

$$\left. w_1 \right|_{x=x_0} = \left. w_2 \right|_{x=x_0} = y_0$$

In this example, $V_1$ is the sheer force in the vertical direction of region 1 and $V_2$ is the sheer force in the vertical direction of region 2. Accordingly, $V_1|_{x=x_0} + F_w = V_2|_{x=0}$ represents that the aggregation of $V_1$ at $x=x_0$ and $F_w$ equals $V_2$ at $x=x_0$. In this example, the moment of region 1 ($M_1$) and the moment of region 2 ($M_2$) are equal at $x=x_0$, as represented by $M_1|_{x=x_0} = M_2|_{x=x_0}$. In this example, $w_1$ represents the displacement in the y-direction for the first region. $w_2$ represents the displacement in the y-direction for the second region. In this example, the slope of beam 102 in region 1 at $x=x_0$ is the same as the slope of the beam in region 2 at $x=x_0$, as represented as $$\left. \frac{dw_1}{dx} \right|_{x=x_0} = \left. \frac{dw_2}{dx} \right|_{x=x_0}.$$

Additionally, in this example, $w_1$ at $x=x_0$ equals $w_2$ at $x=x_0$, which equals $y_0$, as represented as $w_1|_{x=x_0} = w_2|_{x=x_0} = y_0$.

In this example, the boundary condition at the tip of the beam (i.e., where x=L) is represented as shown in the below Table 5:

TABLE 5

$$V_3|_{x=L} = 0$$
$$M_3|_{x=L} = 0$$

As shown in the above Table 5, the sheer force ($V_3$) in the vertical direction at x=L (i.e., $V_3|_{x=L}$) is equal to zero (i.e., $V_3|_{x=L}=0$). In this example, the moment ($M_3$) of beam 102 at x=L (i.e., $M_3|_{x=L}$) is equal to zero (i.e., $M^3|_{x=L}=0$). In this example, the displacement of beam 102 in the y-direction for region 1 ($w_1$) is represented by the equation shown in the below Table 6:

TABLE 6

$$w_1 = \frac{P \cdot b}{EI} \cdot \left( \frac{1}{24} \cdot x^4 - \frac{L}{6} \cdot x^3 + \frac{L^2}{4} \cdot x^2 \right) + \frac{F_w}{EI} \cdot \left( \frac{x_0}{2} \cdot x^2 - \frac{1}{6} \cdot x^3 \right)$$

In this example, P is the uniform pressure across the beam. b is the width of the beam. E is the effective Young's modulus. I is the moment of inertia. L is the length of the beam. x is variable and represents a location on the axis from $x=0$ to $x=x_0$.

In this example, the stress in beam 102 for the first region is represented as at and is determined in accordance with the equation shown in the below Table 7:

TABLE 7

$$\sigma_1 = \frac{h}{2 \cdot I} \cdot \left[ \frac{P \cdot b}{2} \cdot (x-L)^2 + F_w \cdot (x_0 - x) \right]$$

In this example, the variables are defined in accordance with the description provided for Table 6. h is the height of a beam, e.g., as shown in FIG. 4. In this example, the displacement of beam 102 in the y-direction for region 2 ($w_2$) is represented by the equation shown in the below Table 8:

TABLE 8

$$w_2 = \frac{P \cdot b}{EI} \cdot \left( \frac{1}{24} \cdot x^4 - \frac{L}{6} \cdot x^3 + \frac{L^2}{4} \cdot x^2 \right) + \frac{F_w}{EI} \cdot \left( \frac{x_0^2}{2} \cdot x - \frac{1}{6} \cdot x_0^3 \right)$$

In this example, the variables are defined in accordance with the description provided for Table 6, except that x is variable and represents a location on the axis from $x=0$ to $x=L$. In this example, the stress in beam 102 for the second region is represented as $\sigma_2$ and is determined in accordance with the equation shown in the below Table 9:

TABLE 9

$$\sigma_2 = \frac{P \cdot b \cdot h}{4 \cdot I} \cdot (x-L)^2$$

In this example, the variables are defined in accordance with the description provided for Tables 6 and 7, except that x is variable and represents a location on the axis from $x=0$ to $x=L$.

Figure 13:
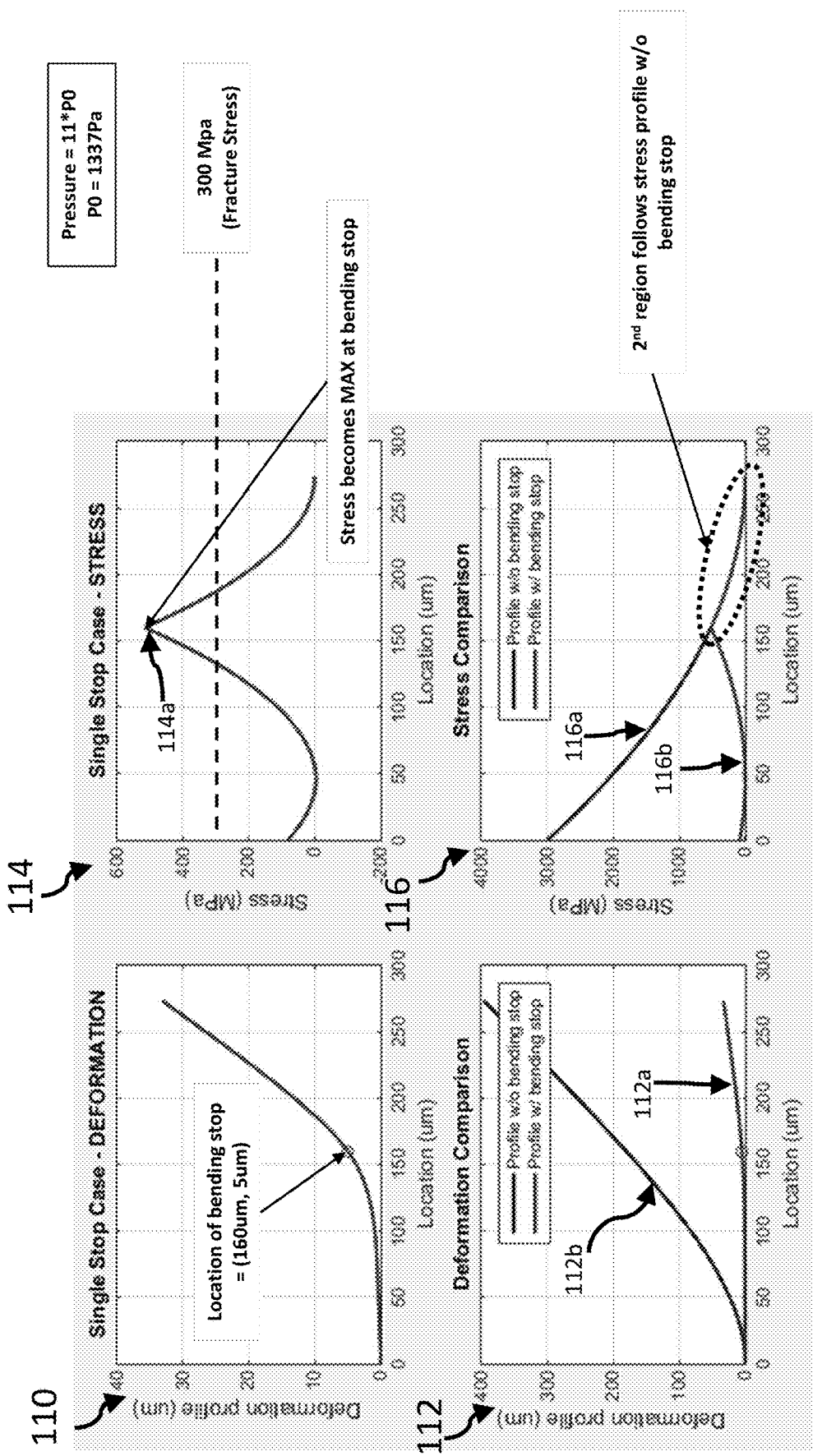

Referring to FIG. 13, a deformation profile for a single-bending stop (e.g., as described in FIG. 12) is shown. In this example, diagram 110 shows the deformation profile for a single bending stop that is located 160 um away from $x=0$ (i.e., $x_0=160$ um) and is located 5 um above the beam (i.e., $y_0=5$ um). In comparison to the deformation profile 90 shown in FIG. 10, deformation profile 110 exhibits less deformation at the beam base (i.e., the area in proximity to $x=0$). Diagram 112 illustrates a deformation comparison of deformation of a beam with a bending stop (i.e., line 112a) and deformation of a beam without a bending stop (i.e., line 112b). As shown in this example, a single bending stop (i.e., physical stop) results in a significantly less amount of deformation.

Diagram 114 illustrates a stress profile with a single bending stop. In this example, point 114a represents a maximum amount of stress, which occurs at the bending stop. As shown in this example, the maximum stress as illustrated by point 114a exceeds the fracture stress of 300 Mpa. Accordingly, a second bending stop may be required to further distribute the stress such that all maximum stress points are below the fracture stress or the location of the bending stop may need to be changed to properly distribute the stress along the beam. In this example, the stress profile from $x=0$ to $x=160$ (i.e., on the x-axis of diagram 114) represents region 1 and the stress profile from $x=160$ onwards represents region 2. Diagram 116 shows a comparison of stress profile 116a without a bending stop and stress profile 116b with a single bending stop. In this example, the second region follows the stress profile without a bending stop.

Figure 14:
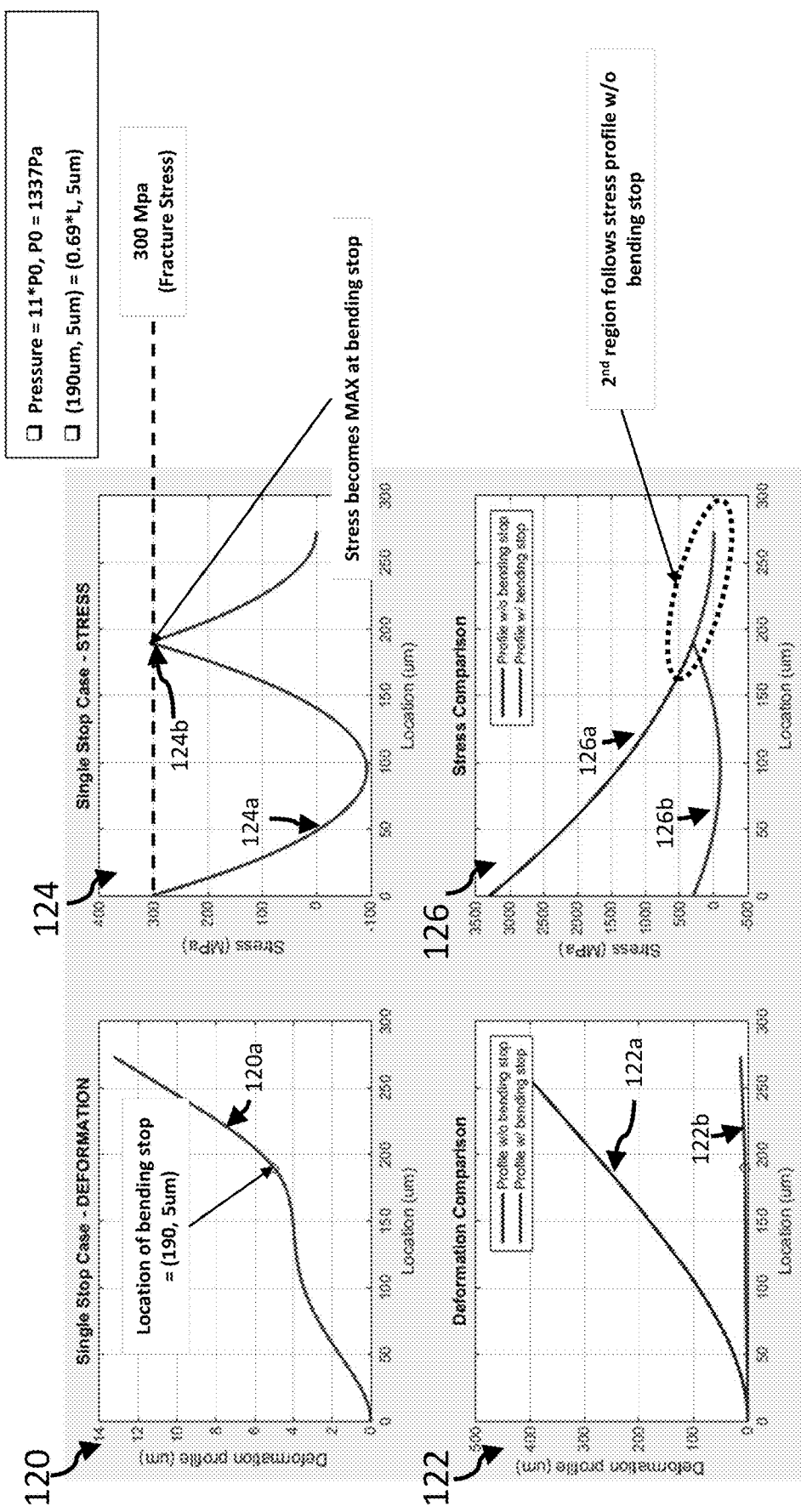

Referring to FIG. 14, deformation profiles are shown when the bending stop is located at $x=190$ um, rather than at $x=160$ um (as shown in FIG. 13). As shown in this example, movement of the bending stop further from the base of the beam and more towards the tip of the beam results in a change in the stress profile and a further distribution of stress away from the base and across the entire beam body. In this example, diagram 120 shows deformation profile 120a when the bending stop is located at $x=190$ um. Diagram 122 illustrates a comparison of deformation profile 122a without a bending stop and deformation profile 122b with a bending stop, when the bending stop is located at $x=190$ um. Diagram 124 illustrates stress profile 124a, e.g., when the bending stop is located at $x=190$ um. In this example, point 124b represents the maximum stress, which is equal to the fracture stress of 300 MPa. Diagram 126 illustrates a comparison of stress profile 126a without a bending stop and stress profile 126b with a bending stop located at $x=190$ um. In this example, the horizontal placement of the bending stop along the x-axis is adjusted and modified until a desired or specified stress profile is achieved.

Figure 15:
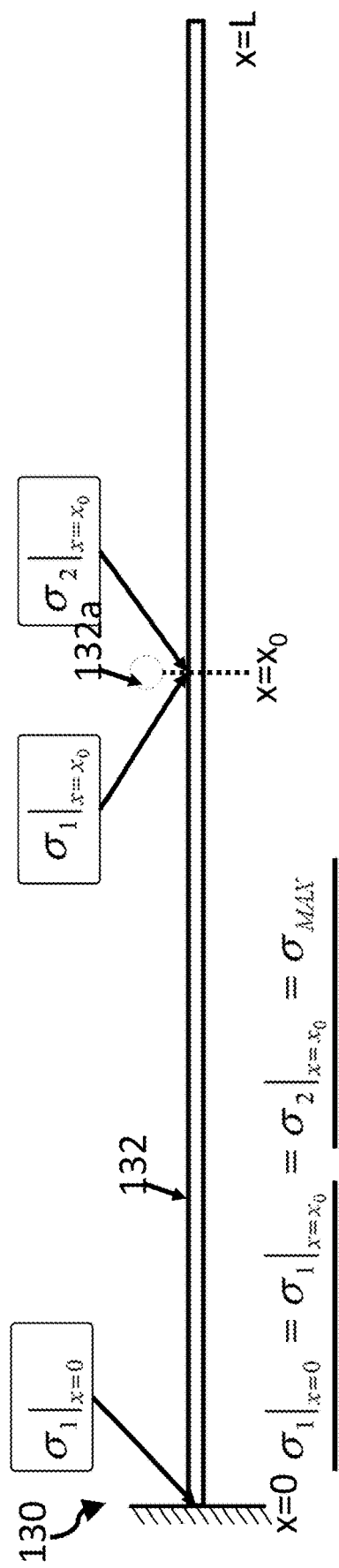

Referring to FIG. 15, diagram 130 illustrates an optimal beam stop location and the degree to which beam 130 is strengthened against breaking due to high applied pressure, when using the optimal location. In this example, the optimal location for a stop is one in which the stress at the beam base is equal to that at the beam stop, and they are both equal to the fracture stress in the material, as captured in the following equation. In this example, the maximum stress ($\sigma_{MAX}$) on beam 132 is a stress at which $$\sigma_1|_{x=0} = \sigma_1|_{x=x_0} = \sigma_2|_{x=x_0} = \sigma_{MAX}.$$

As shown in FIG. 15, the location of stationary element 132a along the axis ($x=x_0$) extending from $x=0$ to $x=L$ is a point at which stress from the first region on the moving portion equals stress from the second region on the moving portion, i.e., $\sigma_1|_{x=x_0} = \sigma_2|_{x=x_0}$. In this example the stress $\sigma_1$ for the first region at $x=0$ (i.e., $\sigma_1|_{x=0}$) is determined in accordance with the equation shown in the below Table 10:

TABLE 10

$$\sigma_1|_{x=0} = \frac{h}{2 \cdot I} \cdot \left[ \frac{P \cdot b \cdot L^2}{2} + F_w \cdot (x_0) \right]$$

In this example the stress $\sigma_1$ for the first region at $x=x_0$ (i.e., $\sigma_1|_{x=x_0}$) is determined in accordance with the equation shown in the below Table 11:

TABLE 11

$$\sigma_1|_{x=x_0} = \frac{P \cdot b \cdot h}{4 \cdot I} \cdot (x_0 - L)^2$$

In this example the stress $\sigma_2$ for the second region at $x=x_0$ (i.e., $\sigma_2|_{x=x_0}$) is determined in accordance with the equation shown in the below Table 12:

TABLE 12

$$\sigma_2|_{x=x_0} = \frac{P \cdot b \cdot h}{4 \cdot I} \cdot (x_0 - L)^2$$

In this example, P is a maximum pressure that can be applied before the beam breaks. In this example, the beam stop is in the optimal location such that $\sigma_1|_{x=0} = \sigma_1|_{x=x_0} = \sigma_2|_{x=x_0} = \sigma_{MAX}$. P is determined in accordance with the equation shown in the below Table 13:

TABLE 13

$$P = \frac{\sigma_{MAX} \cdot 4 \cdot I}{(x_0 - L)^2 \cdot b \cdot h}$$

As shown in the above Table 13, this applied pressure P is also the maximum pressure that can be applied to the beam. In this example, P is also represented in accordance with the equation shown in the below Table 14:

TABLE 14

$$P = \frac{-\frac{3 \cdot y_0 \cdot EI}{x_0^3}}{b \cdot \left[\frac{L^2}{2} - \frac{(x_0-L)^2}{2} - \left(\frac{1}{8} \cdot x_0 - \frac{L}{2} + \frac{3 \cdot L^2}{4 \cdot x_0}\right)\right]}$$

In this example, $P_0$ represents the pressure that would break the beam, without a stop. The ratio $P/P_0$ provides an indication of an increased amount of strength in the beam due to the stop (e.g., a ratio describing how much stronger the beam with a stop is relative to a strength of the beam without a stop, as shown in the below Table 15:

TABLE 15

$$\frac{P}{P_0} = \frac{-\frac{3 \cdot y_0 \cdot EI}{x_0^3}}{b \cdot \left[\frac{L^2}{2} - \frac{(x_0-L)^2}{2} - \left(\frac{1}{8} \cdot x_0 - \frac{L}{2} + \frac{3 \cdot L^2}{4 \cdot x_0}\right)\right]} \cdot \frac{1}{\frac{4 \cdot I \cdot \sigma_{MAX}}{h \cdot b \cdot (x-L)^2}}$$

Referring to the below Table 16, various locations and associated maximum pressures of bending stops are shown (i.e., for determining an optimal location of a bending stop):

TABLE 16

| No. | X0 | Y0 | Max · Pressure |
|---|---|---|---|
| 1 | 194 um | 0.709 * L | 0 um | 12 * P0 (Low sensitivity) |
| 2 | 190 um | 0.695 * L | 5 um | 11 * P0 |
| 3 | 185 um | 0.676 * L | 10 um | 9.5 * P0 |
| 4 | 177 um | 0.647 * L | 15 um | 8 * P0 |

As shown in the above Table 16, the beam is strengthened most when y0=0 but this provides no operating range. As y0 is increased to 5 um, 10 um, and 15 um, the optimal x0 moves from 71% of L to 70%, 68%, and 65% of L respectively. In this example, y0 is selected and an optimal x0 is determined. Then, a maximum pressure the beam can take relative to the maximum without a beam stop is determined.

As further shown in the above Table 16, in a first example, the bending stop is located at $x_0=194$ um (or x=0.709*L) and is located in the y-direction at $y_0=0$ (i.e., there is no distance in the y-direction between the beam and the bending stop). In this example, a very large amount of pressure can be applied to the beam, e.g., without the beam breaking. In this example, the maximum pressure is $12*P_0$, e.g., twelve times what the strength would be without a bending stop. In this example, the beam has a natural operating range of +/−5 um (for a total operating range of 10 um). Accordingly, for this first case scenario, the beam cannot even operate within its normal operating range. The second case scenario puts the stop right at the edge of the operating range and the third case scenario puts the stop beyond the operating range. For the fourth use case, the bending stop is located 15 um above the beam, allowing the beam to operate within its normal operating range and provide eight times more increased strength. In this example, the fourth use case specifies an optimal location for the beam. As is shown in Table 16, as the bending stop moves closer to the beam (i.e., as the value for $y_0$ decreases) the amount of pressure that the beam can handle without breaking also increases.

Figure 16:
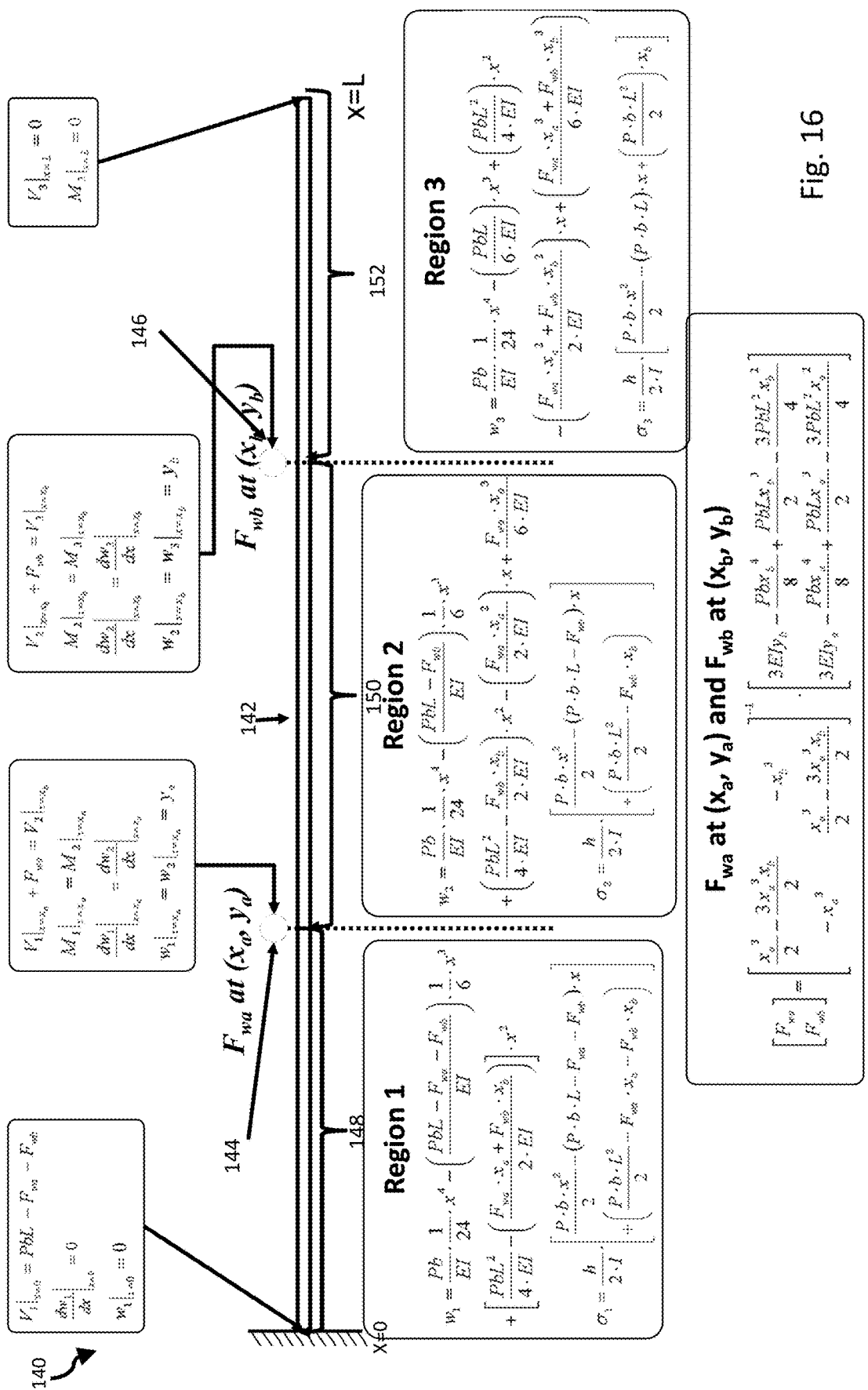

Referring to FIG. 16, diagram 140 illustrates a dual bending-stop example, e.g., when two physical stops are placed above beam 142. In this example, the below described equations are used to solve for the displacement profile, w, and stress profile, σ, as was done for the single stop case. In this example, the equations are solved in the same way—but there are more equations and unknowns to solve. In this example, bending-stop 144 is placed above beam 142 at a height $y_a$ above beam 142 at a location $x=x_a$ along beam 142. Bending-stop 146 is placed above beam 142 at a height $y_b$ above beam 142 at a location $x=x_b$ along beam 142. In this example, bending-stop 146 is a wire bond, a package cap, a MEMS layer, or a microphone package cap.

In this example, bending-stops 144, 146 create three regions 148, 150, 152 relative to beam 142. Region 148 is a first region and is defined as the portion of beam 142 from x=0 to $x=x_a$. Region 150 is a second region and is defined as the portion of beam 142 from $x=x_a$ to $x=x_b$. Region 152 is a third region and is defined as the portion of beam 142 from $x=x_b$ to x=L.

In this example, $F_{wa}$ is the force bending stop 144 exerts on beam 142 to maintain vertical displacement $y_a$ at location $x_a$. In this example, $F_{wb}$ is the force bending stop 146 exerts on beam 142 to maintain vertical displacement $y_b$ at location $x_b$.

In this example, the boundary conditions at x=0 are shown in the below Table 17:

TABLE 17

$$V_1|_{x=0} = PbL - F_{wa} - F_{wb}$$

$$\left.\frac{dw_1}{dx}\right|_{x=0} = 0$$

$$w_1|_{x=0} = 0$$

As shown in the above Table 24, $V_1$ is a sheer force in the vertical direction for the first region and P is the pressure applied to beam 142 by bending-stop 144. $w_1$ is the displacement of beam 142 in the y-direction for the first region (e.g., at point x=0).

The boundary conditions at $x=x_a$ are shown in the below Table 18:

TABLE 18

$$V_1|_{x=x_a} + F_{wa} = V_2|_{x=x_b}$$
$$M_1|_{x=x_a} = M_2|_{x=x_a}$$
$$\frac{dw_1}{dx}\bigg|_{x=x_a} = \frac{dw_2}{dx}\bigg|_{x=x_a}$$
$$w_1|_{x=x_a} = w_2|_{x=x_a} = y_a$$

In this example, $V_2$ is a sheer force in the vertical direction for the second region. $M_1$ is the moment of beam 142 in the first region (i.e., region 148). $M_2$ is the moment of beam 142 in the second region (i.e., region 150). $w_2$ is the displacement of beam 142 in the y-direction for the second region (e.g., at point $x=x_a$ or at $x=x_b$). In this example, the aggregation of the sheer force in the vertical direction for the first region at point $x=x_a$ (i.e., $V_1|_{x=x_a}$) and $F_{wa}$ equals $V_2|_{x=x_a}$, i.e., the sheer force in the vertical direction for the second region at $x=x_b$. In this example, $M_1$ at $x=x_a$ equals $M_2$ at $x=x_a$ (i.e., $M_1|_{x=x_a}=M_2|_{x=x_a}$). The slope of the first region of beam 142 at $x=x_a$ equals the slope of the second region of beam 142 at $x=x_a$ $$\left(\text{i.e.,} \frac{dw_1}{dx}\bigg|_{x=x_a} = \frac{dw_2}{dx}\bigg|_{x=x_a}\right).$$

In this example, $w_1$ (i.e., displacement in the y-direction for the first region) at $x=x_a$ equals $w_2$ (i.e., displacement in the y-direction for the second region) at $x=x_a$, which equals $y_a$.

The boundary conditions at $x=x_b$ are shown in the below Table 19:

TABLE 19

$$V_2|_{x=x_b} + F_{wb} = V_3|_{x=x_b}$$
$$M_2|_{x=x_b} = M_3|_{x=x_b}$$
$$\frac{dw_2}{dx}\bigg|_{x=x_b} = \frac{dw_3}{dx}\bigg|_{x=x_b}$$
$$w_2|_{x=x_b} = w_3|_{x=x_b} = y_b$$

In this example, $V_3$ is a sheer force in the vertical direction for the third region (e.g., at a particular point). $M_3$ is the moment of beam 142 in the third region (i.e., region 152). $W_3$ is the displacement of beam 142 in the y-direction for the third region (e.g., at point $x=x_b$ or at $x=L$). In this example, the aggregation of the sheer force in the vertical direction for the second region at point $x=x_b$ (i.e., $V_2|_{x=x_b}$) and $F_{wa}$ equals $V_3|_{x=x_a}$, i.e., the sheer force in the vertical direction for the third region at $x=x_b$. In this example, $M_2$ at $x=x_b$ equals $M_3$ at $x=x_b$ (i.e., $M_2|_{x=x_b}=M_3|_{x=x_b}$). The slope of the second region of beam 142 at $x=x_b$ equals the slope of the third region of beam 142 at $x=x_b$ $$\left(\text{i.e.,} \frac{dw_2}{dx}\bigg|_{x=x_b} = \frac{dw_3}{dx}\bigg|_{x=x_b}\right).$$

In this example, $w_2$ (i.e., displacement in the y-direction for the second region) at $x=x_b$ equals $w_2$ (i.e., displacement in the y-direction for the second region) at $x=x_b$, which equals $y_a$.

The boundary conditions at $x=L$ are shown in the below Table 20:

TABLE 20

$$V_3|_{x=L} = 0$$
$$M_3|_{x=L} = 0$$

As shown in the above Table 20, $V_3$ (sheer force in the vertical direction) for the third region at $x=L$ has a value of zero (i.e., there is no sheer force at the tip of beam 142 where $x=L$). $M_3$ (moment of beam 142) for the third region at $x=L$ has a value of zero (i.e., there is no movement at the tip of beam 142 where $x=L$).

In this example, $w_1$ for the first region is determined in accordance with the equation shown in the below Table 21:

TABLE 21

$$w_1 = \frac{Pb}{EI} \cdot \frac{1}{24} \cdot x^4 - \left(\frac{PbL - F_{wa} - F_{wb}}{EI}\right) \cdot \frac{1}{6} \cdot x^3 + \left[\frac{PbL^2}{4 \cdot EI} - \left(\frac{F_{wa} \cdot x_a + F_{wb} \cdot x_b}{2 \cdot EI}\right)\right] \cdot x^2$$

x is variable and represents a location on the axis from $x=0$ to $x=x_a$. Stress in the beam for the first region is represented as $\sigma_1$ and is determined in accordance with the equation shown in the below Table 22:

TABLE 22

$$\sigma_1 = \frac{h}{2 \cdot I} \cdot \left[ \begin{array}{c} \frac{P \cdot b \cdot x^2}{2} - (P \cdot b \cdot L - F_{wa} - F_{wb}) \cdot x + \\ \left(\frac{P \cdot b \cdot L^2}{2} - F_{wa} \cdot x_a - F_{wb} \cdot x_b\right) \end{array} \right]$$

As shown in the above Table 29, x is variable and represents a location on the axis from $x=0$ to $x=x_a$.

In this example, $w_2$ for the second region is determined in accordance with the equation shown in the below Table 23:

TABLE 23

$$w_2 = \frac{Pb}{EI} \cdot \frac{1}{24} \cdot x^4 - \left(\frac{PbL - F_{wb}}{EI}\right) \cdot \frac{1}{6} \cdot x^3 + \left(\frac{PbL^2}{4 \cdot EI} - \frac{F_{wb} \cdot x_b}{2 \cdot EI}\right) \cdot x^2 - \left(\frac{F_{wa} \cdot x_a^2}{2 \cdot EI}\right) \cdot x + \frac{F_{wa} \cdot x_a^3}{6 \cdot EI}$$

x is variable and represents a location on the axis from $x=x_a$ to $x=x_b$. Stress in the beam for the second region is represented as $\sigma_2$ and is determined in accordance with the equation shown in the below Table 24:

TABLE 24

$$\sigma_2 = \frac{h}{2 \cdot I} \cdot \left[ \begin{array}{c} \frac{P \cdot b \cdot x^2}{2} - (P \cdot b \cdot L - F_{wb}) \cdot x + \\ \left(\frac{P \cdot b \cdot L^2}{2} - F_{wb} \cdot x_b\right) \end{array} \right]$$

As shown in the above Table 24, x is variable and represents a location on the axis from $x=x_a$ to $x=x_b$.

In this example, $w_3$ for the second region is determined in accordance with the equation shown in the below Table 25:

TABLE 25

$$w_3 = \frac{Pb}{EI} \cdot \frac{1}{24} \cdot x^4 - \left(\frac{PbL}{6 \cdot EI}\right) \cdot x^3 + \left(\frac{PbL^2}{4 \cdot EI}\right) \cdot x^2 -$$
$$\left(\frac{F_{wa} \cdot x_a^2 + F_{wb} \cdot x_b^2}{2 \cdot EI}\right) \cdot x + \left(\frac{F_{wa} \cdot x_a^3 + F_{wb} \cdot x_b^3}{6 \cdot EI}\right)$$

x is variable and represents a location on the axis from $x=x_b$ to $x=L$. Stress in the beam for the second region is represented as σ and is determined in accordance with the equation shown in the below Table 26:

TABLE 26

$$\sigma_3 = \frac{h}{2 \cdot I} \cdot \left[\frac{P \cdot b \cdot x^2}{2} - (P \cdot b \cdot L) \cdot x + \left(\frac{P \cdot b \cdot L^2}{2}\right) \cdot x_b\right]$$

As shown in the above Table 26, x is variable and represents a location on the axis from $x=x_b$ to $x=L$.

In this example, $F_{wa}$ at ($x_a$, $y_a$) and $F_{wb}$ at ($x_b$, $y_b$) are represented in accordance with the equation shown in the below Table 27:

TABLE 27

$$\begin{bmatrix} F_{wa} \\ F_{wb} \end{bmatrix} = \begin{bmatrix} \frac{x_a^3}{2} - \frac{3x_a^2 x_b}{2} & -x_b^3 \\ -x_a^3 & \frac{x_a^3}{2} - \frac{3x_a^2 x_b}{2} \end{bmatrix}^{-1} \cdot$$
$$\begin{bmatrix} 3EIy_b - \frac{Pbx_b^4}{8} + \frac{PbLx_b^3}{2} - \frac{3PbL^2 x_b^2}{4} \\ 3EIy_a - \frac{Pbx_a^4}{8} + \frac{PbLx_a^3}{2} - \frac{3PbL^2 x_a^2}{4} \end{bmatrix}$$

Referring to Table 28 below, the various candidate locations (i.e., in the x-direction and in the y-direction) of a dual bending-stops are shown:

TABLE 28

| No. | $x_a$ | $y_a$ | $x_b$ | $y_b$ | Max Pressure |
|---|---|---|---|---|---|
| 1 | 114 um | 0 um | 228 um | 0 um | 35 * $P_0$ |
| 2 | 117 um | 5 um | 266 um | 5 um | 17 * $P_0$ |
| 3 | 185 um | 10 um | N/A | N/A | 9.5 * $P_0$ |
| 4 | 157 um | 15 um | N/A | N/A | 8 * $P_0$ |

In this example, a beam has an operating range of +/−5 um (i.e., an operating range of 10 um). As shown in the above Table 35, the first example places the dual-bending stop inside the operating range (i.e., $y_a=0$ um) and therefore may not represent optimal locations of the dual bending-stop. In this example, the second case represents $y_a$ at an edge of the operating range. The values at 10 um and 15 um are the same as the single stop case because the addition of a second stop does not improve the maximum pressure for these values of $y_a$. In these examples, the beam can sustain 17 times the amount of pressure it can sustain without the dual bending-stops.

Figure 17:
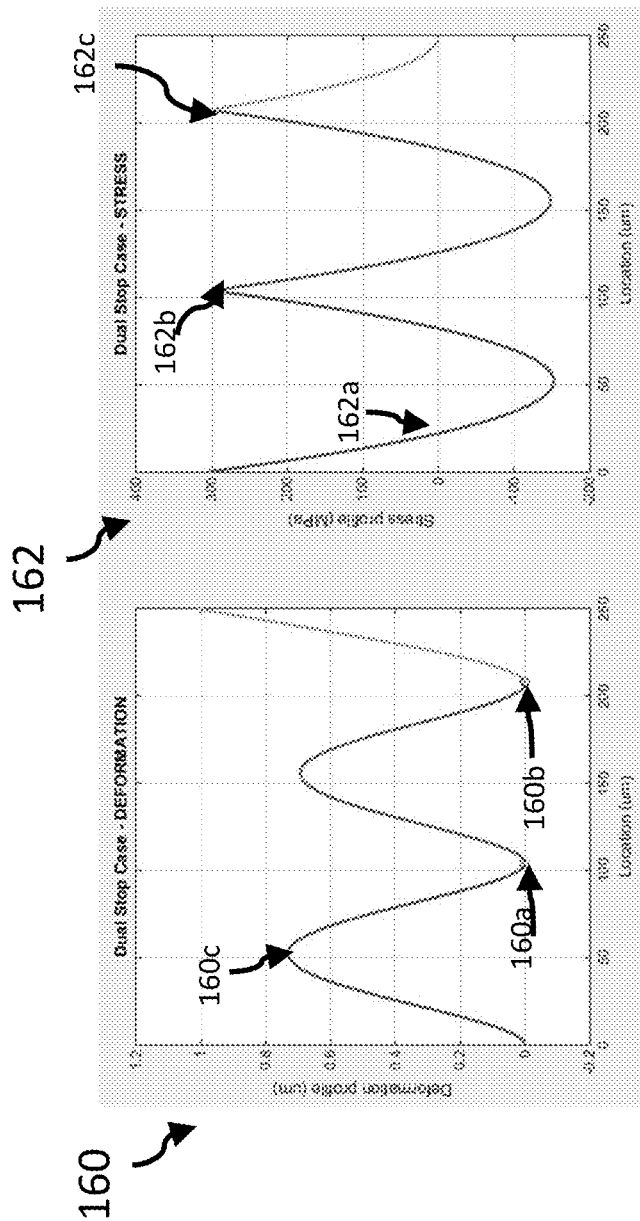

Referring to FIG. 17, diagram 160 illustrates deformation profile 160c with dual bending-stops located at points 160a, 160b (e.g., ~$x_a$=100 um and $x_b$=200 um). Diagram 162 illustrates stress profile 162a for the dual bending-stops. In this example, points 162b, 162c represent the maximum stress points (which also correspond to where the dual bending-stops are located). In this example, the stress is evenly distributed among points 162b, 162c.

Figure 18B:
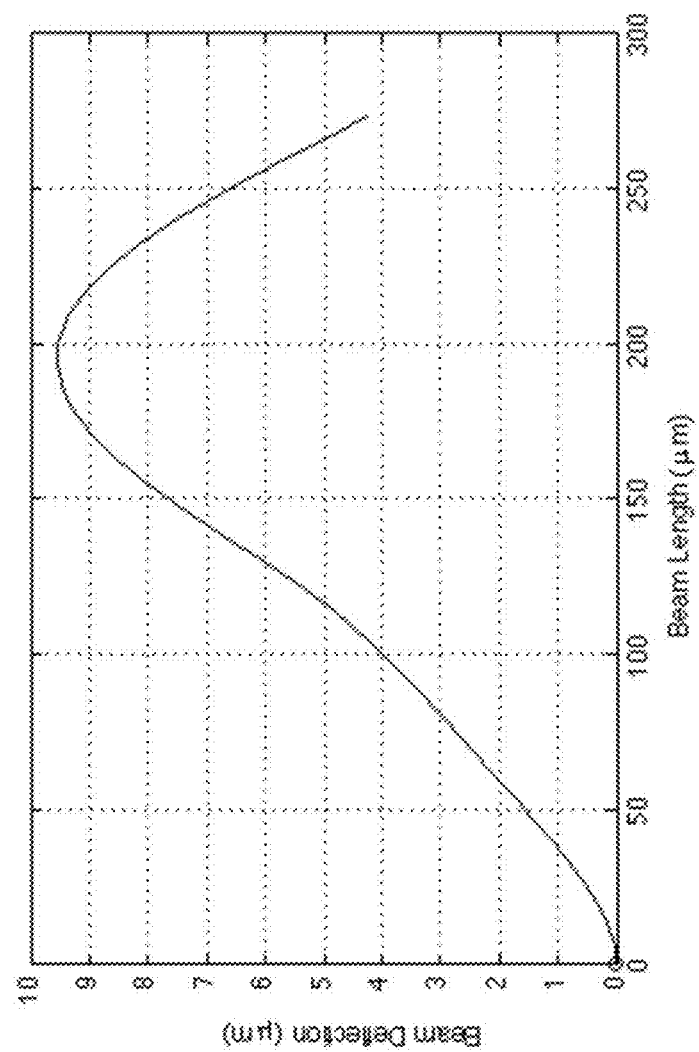

Referring to FIG. 18A, stress profile 168 is shown for a dual bending stop at $x_a$=117 um and $x_b$=266 um and $y_a$=5 um, as shown in the second example in FIG. 28. In this example, stress profile 168 does not go above 300 MPa. In this example, the fracture stress is +/−300 MPa. Accordingly, in this example the beam does not fracture as the amount of stress does not exceed the fracture stress. Referring to FIG. 18B, deformation profile 169 is shown for dual bending stop at $x_a$=117 um and $x_b$=266 um and $y_a$=5 um, as shown in the second example in FIG. 28. As shown in this example, the beam deflection is equal at the location of the two bending stops, $x_a$=117 um and $x_b$=266 um. In contrast to FIG. 10, the beam deflection does not increase linearly or near linearly across the length of the beam. Rather, the beam deflection starts to decrease at approximately a halfway point between the first and second bending stops.

Figure 19:
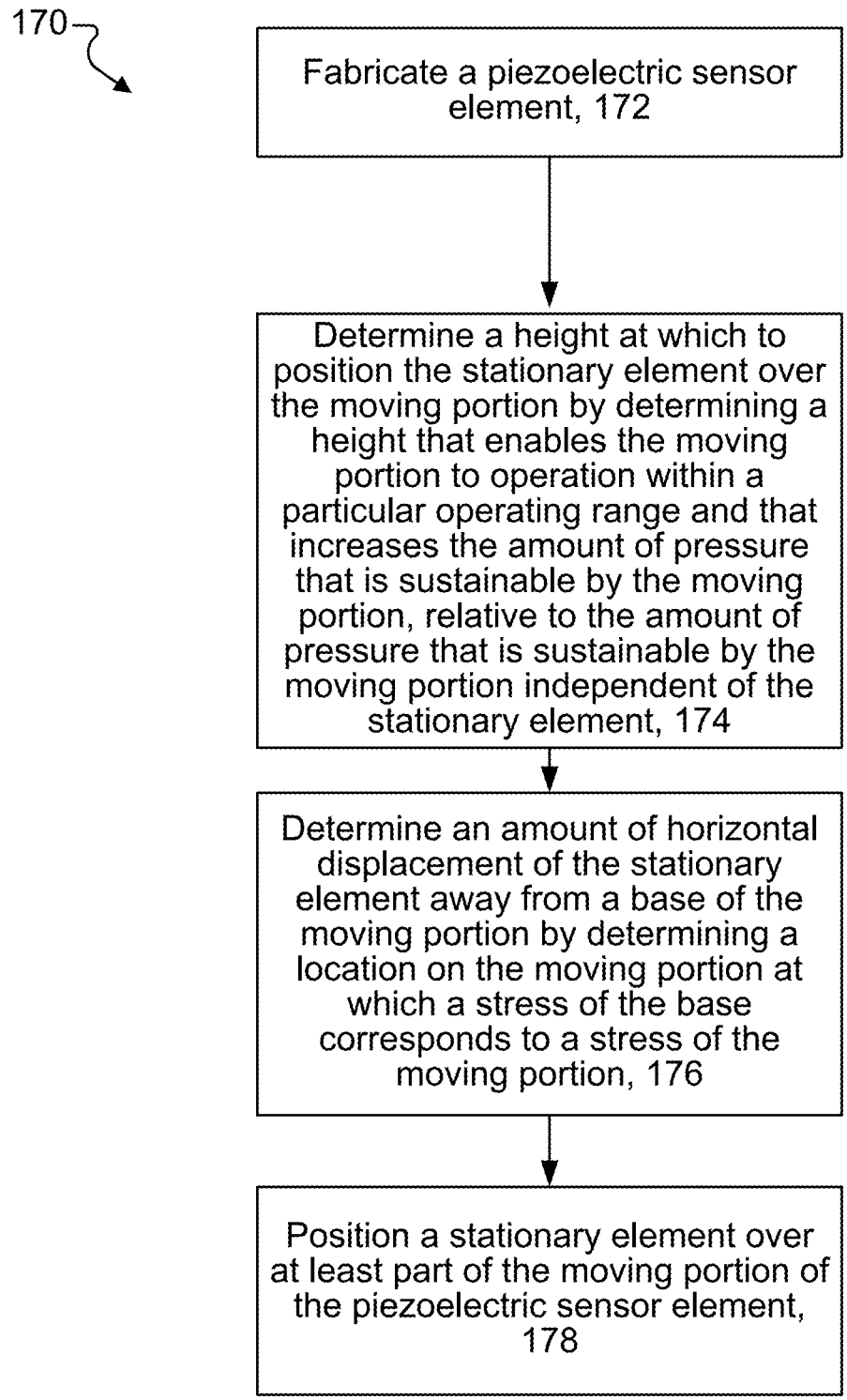
FIG. 19 is a diagram of a process of fabricating a transducer device with a stationary element.

Referring to FIG. 19, process 170 is implemented to fabricate a transducer with a stationary element, e.g., to increase a beam strength of the transducer. In operation, a piezoelectric sensor element is fabricated (172) with a moving portion that is configured to move in response to input pressure, with the stationary element positioned in proximity to a moving portion. In this example, the piezoelectric sensor element is a non-capacitive sensor element.

A height at which to position the stationary element over the moving portion is determined (174) by determining a height that enables the moving portion to operation within a particular operating range and that increases the amount of pressure that is sustainable by the moving portion, relative to the amount of pressure that is sustainable by the moving portion independent of the stationary element. An amount of horizontal displacement of the stationary element away from a base of the moving portion is also determined (176) by determining a location on the moving portion at which a stress of the base corresponds to a stress of the moving portion, e.g., as shown in FIG. 15.

A stationary element (e.g., a bending stop or a physical stop) is positioned (178) over at least part of the moving portion of the piezoelectric sensor element, with the stationary element positioned in proximity to the moving portion of the piezoelectric sensor element, and with proximity of the stationary element to the moving portion reducing a probability of breakage of the piezoelectric sensor element by limiting an excursion of the piezoelectric sensor element, relative to a probability of breakage of the piezoelectric sensor element in a piezoelectric MEMS device without the stationary element.

In an example, a beam or plate has a geometry as described in U.S. Pat. No. 8,531,088B2. This geometry has a closed form solution that is used in solving the foregoing equations, e.g., to determine values for x0 and y0. In a variation, an acoustic transducer has a gap controlling geometry (such as that described in U.S. Pat. No. 9,055,372). This is geometry without a closed form solution. Accordingly, finite element analysis software is used to determine which locations of stationary elements are appropriate for that geometry.

Figure 20:
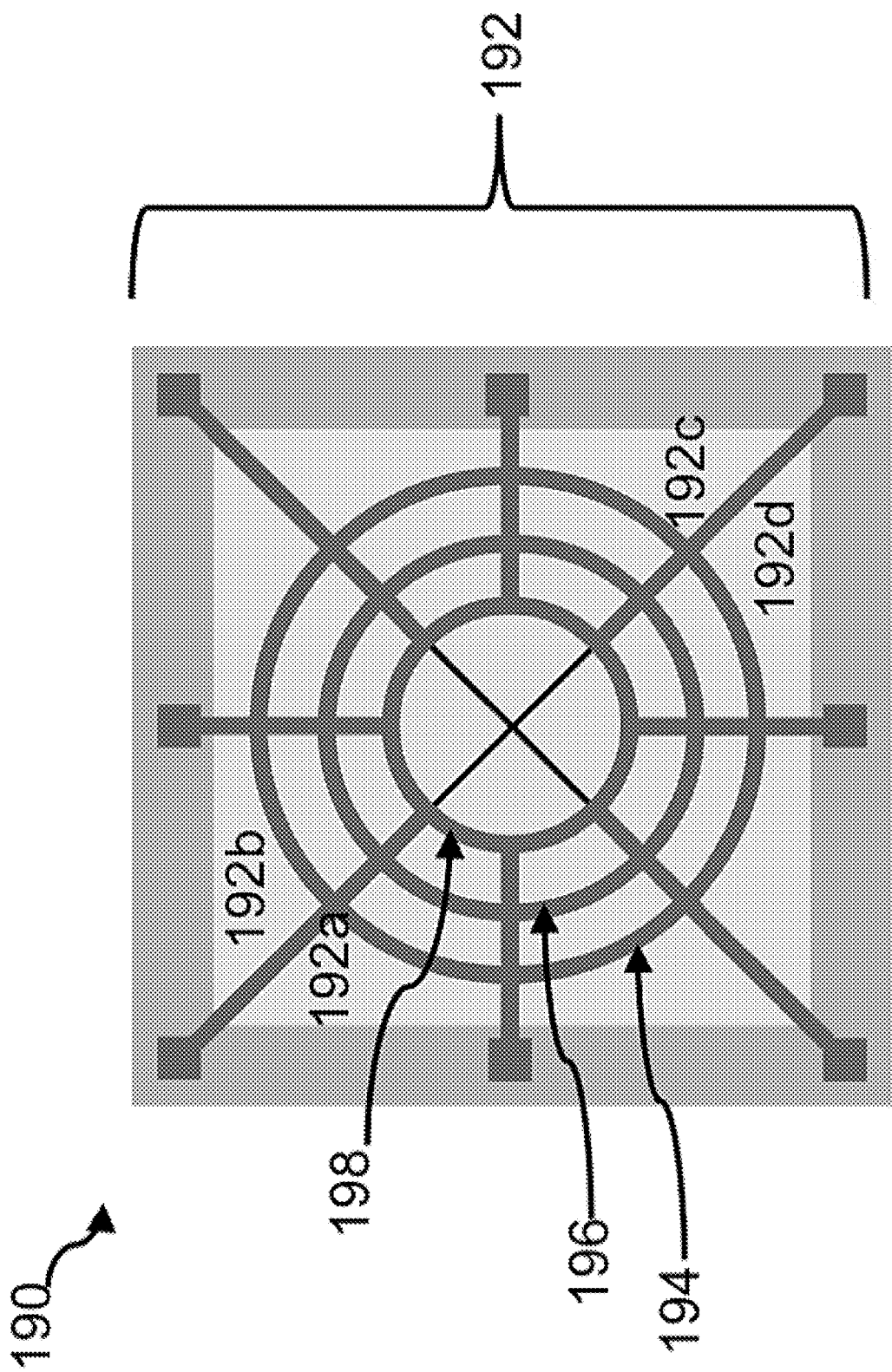
FIGS. 20-23 are diagrams of various shapes of physical elements.

Referring to FIGS. 20-23, a physical element can be fabricated to embody various shapes and forms as MEMS layers, wire bonds, and so forth. Referring to FIG. 20, diagram 190 illustrates a bird's eye view of transducer 192, for example, as described in U.S. Pat. No. 9,055,372. In this example, transducer 192 includes a diaphragm that includes moving portions 192a-192d. In this example, a MEMS layer is fabricated over moving portions 192a-192d. The MEMS layer includes circular portions 194, 196, 198 that form the physical element above the diaphragm. In this example, circular portions 194, 196, 198 cover a relatively small portion of the diaphragm, therefore not introducing a significant amount of noise into transducer 192.

Figure 21:
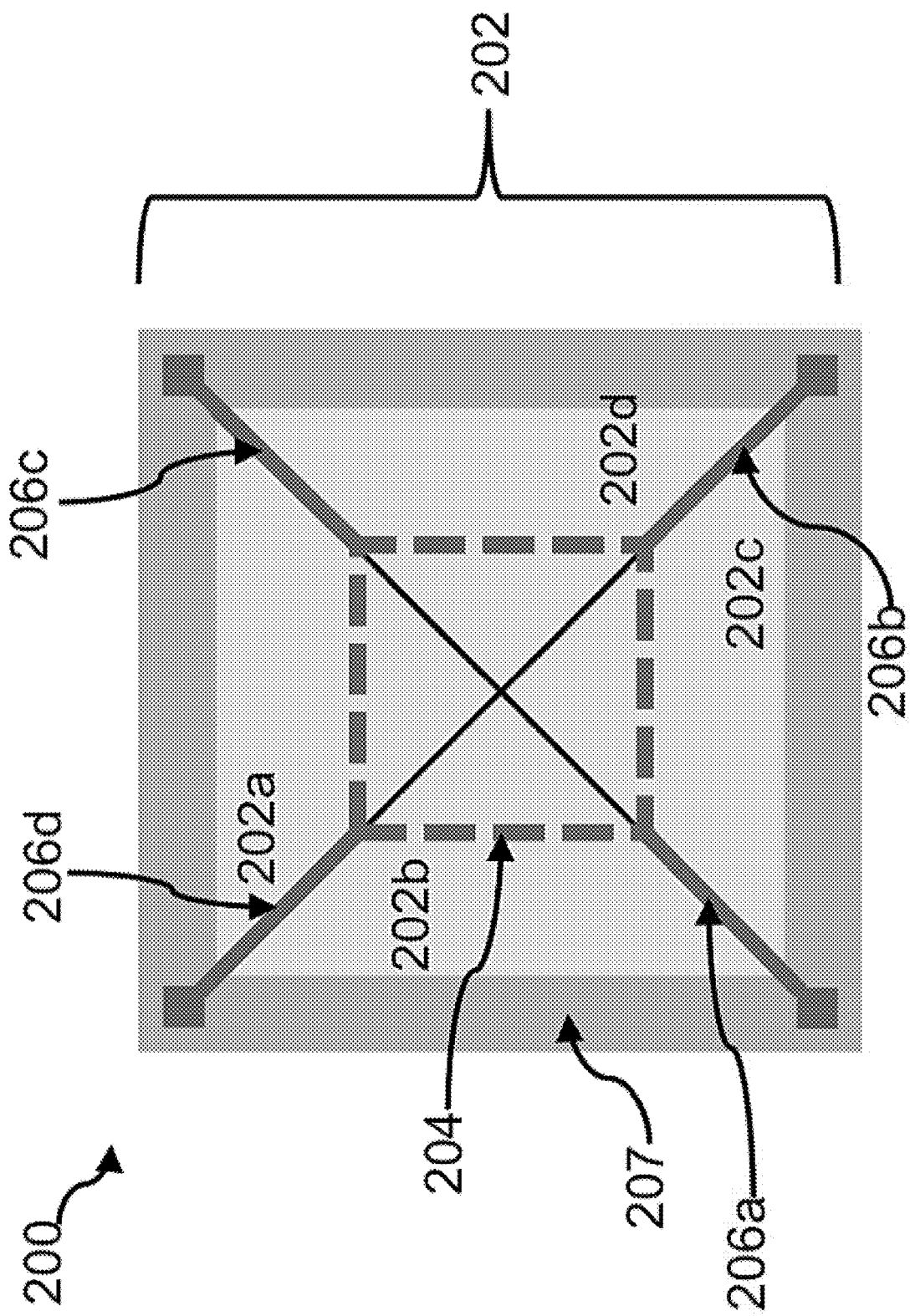

Referring to FIG. 21, diagram 200 shows another bird's eye view of a top of transducer 202. In this example, the top of transducer 202 is a diaphragm comprised of four different moving portions 202a-202d, with each moving portion being represented as a triangle in FIG. 21. In this example, a MEMS layer acts as a physical element over the diaphragm. The MEMS layer may be fabricated on another substrate (a sacrificial substrate) and then subsequently placed over the diaphragm. In another example, the MEMS layer can be fabricated directly over the diaphragm, for example, on a sacrificial substrate over the diaphragm that is then removed. Transducer 202 also includes substrate 207, which holds that the diaphragm comprising moving portions 202a-202d. In this example, the physical element includes portion 204 and legs 206a-206d. Portion 204 represents a hollow square or rectangle (or another shape) that is placed over the diaphragm. The hollow square or rectangle is attached to substrate 207 by legs 206-206d. In this example, portion 204 and legs 206a-206d are the physical element and are a MEMS layer (an aluminum layer with a shape that is fabricated through a MEMS process).

Figure 22:
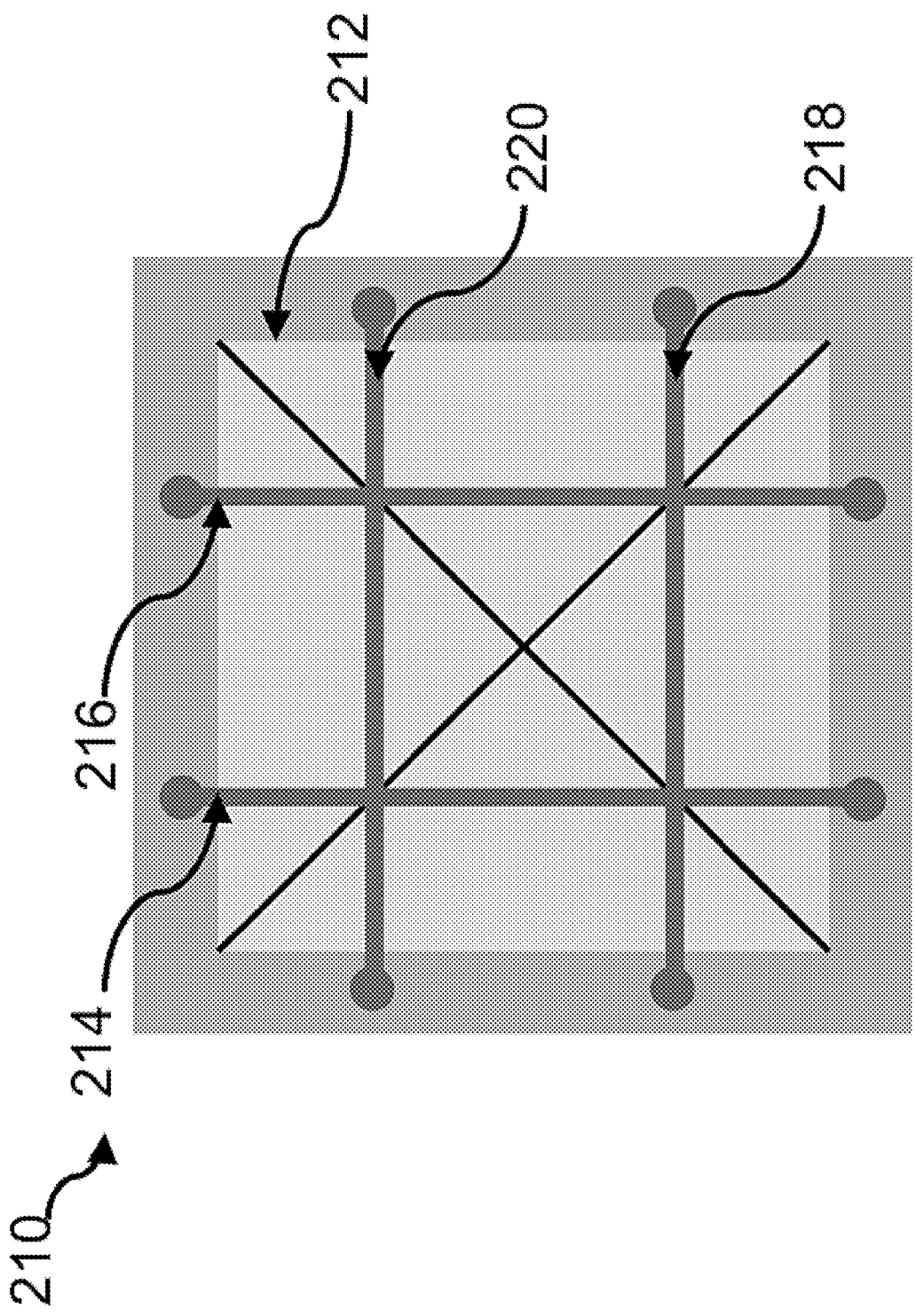

Referring to FIG. 22, diagram 210 is a bird's eye view of transducer 212. In this example, wire bonds 214, 216, 218, 220 are physical elements that are placed over the diaphragm of transducer 212. In this example, the ends of each of wire bonds 214, 216, 218, 220 are attached to the underlying substrate of transducer 212.

Figure 23:
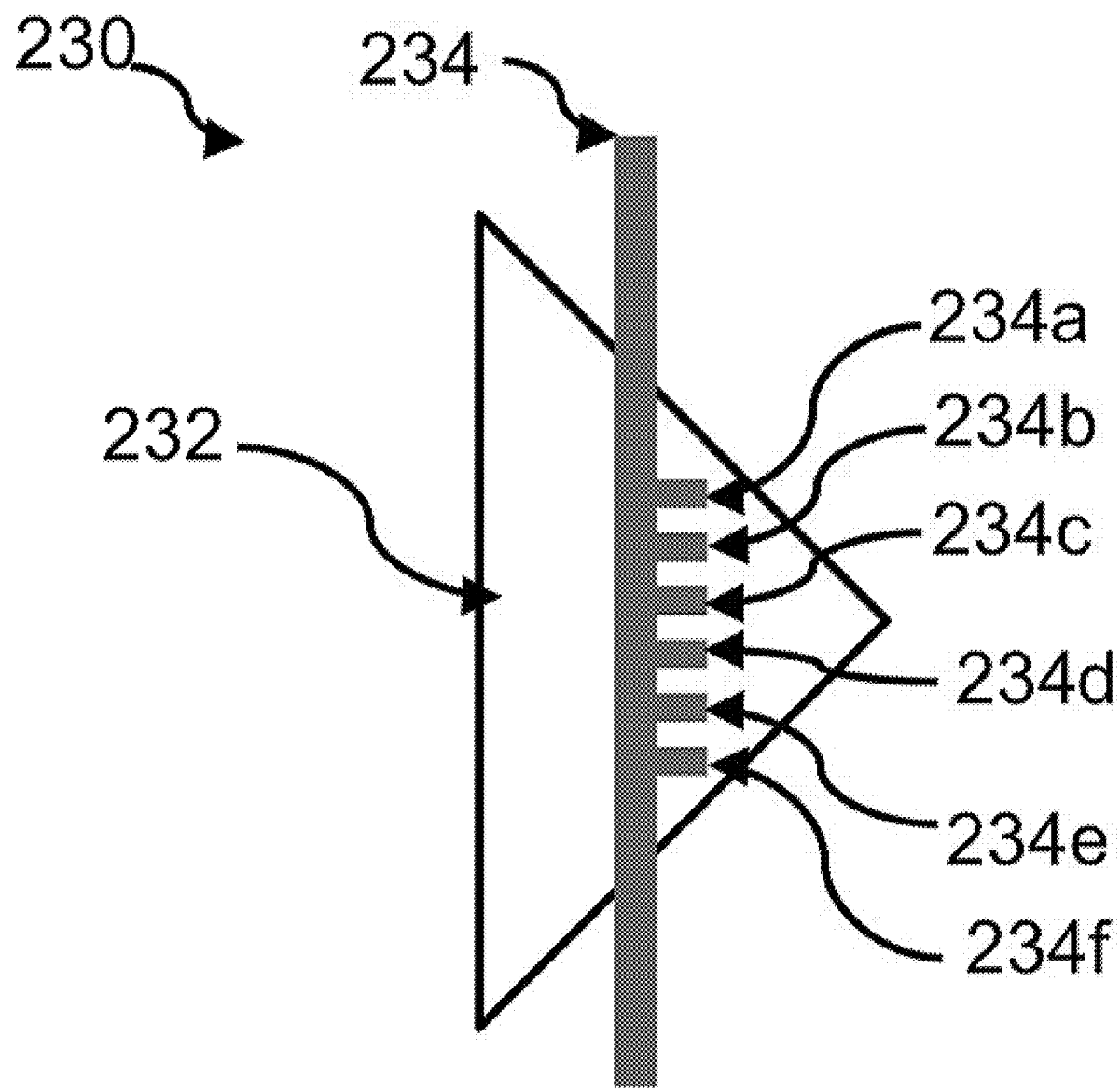

Referring to FIG. 23, diagram 230 illustrates moving portion 232 of the diaphragm of a transducer. In this example, physical element 234 is a MEMS layer that is fabricated through a MEMS process. In this example, physical element 234 includes a plurality of fingers 234a-234f that are part of physical element 234. In this example, fingers 234a-234f are fabricated through a MEMS process of masking portions of a layer that represent the fingers and then etching away the unmasked portions of the layer. In this example, fingers 234a-234f of physical element 234 reduce the likelihood of physical element 234 sticking to moving portion 232, as moving portion 232 moves upwards in response to input pressure received by the transducer. In still other examples, the physical element can be fabricated with a curvature that matches the shape of the diaphragm as deflected.

Using the techniques described herein, a MEMS device includes a beam strengthening stationary element that strengthens a beam or a plate to allow the beam or the plate to handle and sustain an increased amount of pressure without breaking or fracturing.

Embodiments can be implemented in digital electronic circuitry, or in computer hardware, firmware, software, or in combinations thereof. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Any of the foregoing can be supplemented by, or incorporated in, ASICs (application-specific integrated circuits).

Other embodiments are within the scope and spirit of the description and the claims. For example, the techniques described herein can be applied to various types of devices, including, e.g., a (MEMS) device, an accelerometer, a transducer, an acoustic transducer, an acoustic sensor, a sensor, a microphone or a gyroscope. Additionally, these techniques are applicable to various types of transducers, including, e.g., the transducers described in the foregoing referenced patents, transducers in which the piezoelectric sensor element comprises a plurality of tapered, transducer beams, with a tapered, transducer beam comprising a piezoelectric layer and a pair of electrode layers sandwiching the piezoelectric layer, the tapered, transducer beams each having a beam base, a beam end, and a beam body, the tapered, transducer beams connected in a cantilever arrangement over the substrate by having the beam bases attached to the substrate, the beam ends converging towards a single point, and with each beam body free from the substrate and with each beam end free and unattached and in which the piezoelectric sensor element comprises a plurality of beams each supported at one end by the substrate such that each beam is cantilevered and extends between a fixed end and a free end, wherein at least two of the beams are positioned such that free ends of each beam face one another and are separated by a gap.

Additionally, due to the nature of software, functions described above can be implemented using software, hardware, firmware, hardwiring, or combinations of any of these. The use of the term "a" herein and throughout the application is not used in a limiting manner and therefore is not meant to exclude a multiple meaning or a "one or more" meaning for the term "a." Additionally, to the extent priority is claimed to a provisional patent application, it should be understood that the provisional patent application is not limiting but includes examples of how the techniques described herein may be implemented.

A number of embodiments have been described. Nevertheless, it will be understood that various modifications may be made without departing from the spirit and scope of the claims and the examples of the techniques described herein.

What is claimed is:

1. A piezoelectric Micro-Electro-Mechanical Systems (MEMS) device comprising:
   a physical element; and
   a piezoelectric sensor element, with the physical element positioned in proximity to a moving portion of the piezoelectric sensor element, and with proximity of the physical element to the moving portion limiting an excursion of the piezoelectric sensor element, by providing a physical stop for the moving portion of the piezoelectric element.

2. The piezoelectric MEMS device of claim 1, wherein a maximum excursion of the piezoelectric sensor element is limited by the physical element.

3. The piezoelectric MEMS device of claim 1, wherein the piezoelectric MEMS device is a MEMS microphone, a transducer, or an acoustic transducer.

4. The piezoelectric MEMS device of claim 1, wherein the physical element is a wire bond, a package cap or a microphone package cap.

5. The piezoelectric MEMS device of claim 1, wherein the piezoelectric sensor element comprises a first electrode layer, a second electrode layer and a piezoelectric layer sandwiched between the first and second electrode layers.

6. The piezoelectric MEMS device of claim 1, wherein the physical element is located at a vertical distance above the moving portion of the piezoelectric sensor element that allows for a particular operating range of the moving portion.

7. The piezoelectric MEMS device of claim 1, wherein the physical element causes a redistribution of stress from a base of the moving portion throughout a body of the moving portion.

8. The piezoelectric MEMS device of claim 7, wherein the redistribution causes a maximum stress to occur at the physical element.

9. The piezoelectric MEMS device of claim 8, wherein the maximum stress is less than or equal to a fracture stress at which the moving portion fractures.

10. The piezoelectric MEMS device of claim 1, wherein a base of the moving portion is a point at which a variable x denoting a point on an axis equals 0 (x=0), wherein the axis extends from a beginning point at x=0 to a point at the end of the moving portion at which x=L, the length of the moving portion;
   wherein a portion of the moving portion extending from x=0 to a location of the physical element (x=x0) is a first region;
   wherein a portion of the moving portion extending from x=x0 to x=L is a second region;
   wherein the location of the physical element (x=x0) along the axis extending from x=0 to x=L is a point at which stress from the first region on the moving portion equals stress from the second region on the moving portion.

11. The piezoelectric MEMS device of claim 1, wherein the physical element is a first physical element and wherein the piezoelectric MEMS device further comprises:
   a second physical element positioned in proximity to the moving portion of the piezoelectric sensor element.

12. The piezoelectric MEMS device of claim 11, wherein the first and second physical elements are each a same vertical distance above the moving portion.

13. The piezoelectric MEMS device of claim 11, wherein the second physical element is a wire bond, a package cap or a microphone package cap.

14. The piezoelectric MEMS device of claim 11, wherein the first and second physical elements causes a redistribution of stress from a base of the moving portion throughout a body of the moving portion.

15. The piezoelectric MEMS device of claim 14, wherein the redistribution causes a maximum stress to occur at each of the first and second physical elements.

16. The piezoelectric MEMS device of claim 15, wherein the maximum stress is less than or equal to a fracture stress at which the moving portion fractures.

17. The piezoelectric MEMS device of claim 1, further comprising a substrate, and wherein the piezoelectric sensor element comprises a plurality of tapered, transducer beams, with a tapered, transducer beam comprising a piezoelectric layer and a pair of electrode layers sandwiching the piezoelectric layer, the tapered, transducer beams each having a beam base, a beam end, and a beam body, the tapered, transducer beams connected in a cantilever arrangement over the substrate by having the beam bases attached to the substrate, the beam ends converging towards a single point, and with each beam body free from the substrate and with each beam end free and unattached.

18. The piezoelectric MEMS device of claim 1, further comprising a substrate and wherein the piezoelectric sensor element comprises a plurality of beams each supported at one end by the substrate such that each beam is cantilevered and extends between a fixed end and a free end, wherein at least two of the beams are positioned such that free ends of each beam face one another and are separated by a gap.

19. The piezoelectric MEMS device of claim 1, wherein positioning the physical element in proximity to the moving portion of the piezoelectric sensor element, limits the excursion of the moving portion of piezoelectric sensor element and reduces stress on the moving portion of the piezoelectric sensor element.

* * * * *